United States Patent
Harrold et al.

(10) Patent No.: US 11,652,195 B2
(45) Date of Patent: May 16, 2023

(54) ILLUMINATION APPARATUS COMPRISING PASSIVE OPTICAL NANOSTRUCTURES

(71) Applicant: RealD Spark, LLC, Beverly Hills, CA (US)

(72) Inventors: Jonathan Harrold, Upper Heyford (GB); Michael G. Robinson, Boulder, CO (US); Graham J. Woodgate, Henley-on-Thames (GB)

(73) Assignee: RealD Spark, LLC, Beverly Hills, CA (US)

( * ) Notice: Subject to any disclaimer, the term of this patent is extended or adjusted under 35 U.S.C. 154(b) by 219 days.

(21) Appl. No.: 17/060,995

(22) Filed: Oct. 1, 2020

(65) Prior Publication Data

US 2021/0104647 A1    Apr. 8, 2021

Related U.S. Application Data

(60) Provisional application No. 62/979,029, filed on Feb. 20, 2020, provisional application No. 62/910,204, filed on Oct. 3, 2019.

(51) Int. Cl.
*H01L 33/58* (2010.01)
*H01L 33/24* (2010.01)
(Continued)

(52) U.S. Cl.
CPC .............. *H01L 33/58* (2013.01); *B82Y 20/00* (2013.01); *H01L 33/24* (2013.01); *H01L 33/62* (2013.01); *H01L 2933/0058* (2013.01)

(58) Field of Classification Search
None
See application file for complete search history.

(56) References Cited

U.S. PATENT DOCUMENTS 5,184,114 A    2/1993 Brown
5,812,105 A    9/1998 Ven
(Continued)

FOREIGN PATENT DOCUMENTS

CN    102859268 A    1/2013
CN    103117348 A    5/2013
(Continued)

OTHER PUBLICATIONS

CN201980030275.0 Notification of the First Office Action dated Mar. 4, 2022.
(Continued)

*Primary Examiner* — Robert K Carpenter
(74) *Attorney, Agent, or Firm* — Penny L. Lowry

(57) ABSTRACT

An illumination apparatus is manufactured by selectively removing passive optical nanostructures from a monolithic array of light-emitting elements while preserving their relative spatial position. The nanostructures are selected such that, in at least one direction, for at least one pair of the selectively removed passive optical nanostructures, for each respective pair there is at least one nanostructure that is not selected that was positioned in the monolithic array between the pair of selectively removed passive optical nanostructures in the at least one direction, forming a non-monolithic array of passive optical nanostructures with the selectively removed passive optical nanostructures while preserving their relative spatial position, and aligning each of the passive optical nanostructures of the non-monolithic array with a respective light-emitting element of the non-monolithic array of light-emitting elements.

43 Claims, 25 Drawing Sheets

(51) Int. Cl.
  *H01L 33/62* (2010.01)
  *B82Y 20/00* (2011.01)

(56) References Cited

U.S. PATENT DOCUMENTS

| | | |
|---|---|---|
| 6,547,423 B2 | 4/2003 | Marshall et al. |
| 6,570,324 B1 | 5/2003 | Tutt et al. |
| 7,014,964 B1 | 3/2006 | Hsu et al. |
| 7,084,435 B2 | 8/2006 | Sugimoto et al. |
| 7,171,874 B1 | 2/2007 | Huang |
| 7,863,614 B2 | 1/2011 | Toyama et al. |
| 7,994,531 B2 | 8/2011 | Lin et al. |
| 8,721,115 B2 | 5/2014 | Ing et al. |
| 8,794,792 B1 | 8/2014 | Moghal et al. |
| 9,519,153 B2 | 12/2016 | Robinson et al. |
| 10,121,772 B1 | 11/2018 | Wu et al. |
| 10,126,575 B1 | 11/2018 | Robinson et al. |
| 10,303,030 B2 | 5/2019 | Robinson et al. |
| 10,533,730 B2 | 1/2020 | Harrold et al. |
| 11,063,193 B2 | 7/2021 | Woodgate et al. |
| 2004/0080938 A1 | 4/2004 | Holman et al. |
| 2004/0089935 A1 | 5/2004 | Lehner |
| 2004/0126911 A1 | 7/2004 | Kimura |
| 2004/0161871 A1 | 8/2004 | Omori |
| 2004/0218390 A1 | 11/2004 | Holman et al. |
| 2004/0239243 A1 | 12/2004 | Roberts et al. |
| 2004/0263061 A1 | 12/2004 | Ishikawa et al. |
| 2005/0111100 A1 | 5/2005 | Mather et al. |
| 2005/0219693 A1 | 10/2005 | Hartkop et al. |
| 2006/0152931 A1 | 7/2006 | Holman |
| 2006/0221611 A1 | 10/2006 | Noh et al. |
| 2006/0256255 A1 | 11/2006 | Minami |
| 2006/0290276 A1 | 12/2006 | Cok et al. |
| 2007/0007237 A1 | 1/2007 | Wu et al. |
| 2007/0019131 A1 | 1/2007 | Choi et al. |
| 2007/0047254 A1 | 3/2007 | Schardt et al. |
| 2007/0116424 A1 | 5/2007 | Ting et al. |
| 2007/0165394 A1 | 7/2007 | Chang |
| 2007/0176195 A1 | 8/2007 | Kuiseko et al. |
| 2007/0236628 A1 | 10/2007 | Epstein |
| 2007/0242477 A1 | 10/2007 | Yoo et al. |
| 2007/0256453 A1 | 11/2007 | Barnes et al. |
| 2008/0043466 A1 | 2/2008 | Chakmakjian et al. |
| 2008/0089093 A1 | 4/2008 | Miller et al. |
| 2008/0123350 A1 | 5/2008 | Choe et al. |
| 2008/0225523 A1 | 9/2008 | Samber et al. |
| 2008/0237612 A1 | 10/2008 | Cok |
| 2008/0258162 A1 | 10/2008 | Koung et al. |
| 2008/0285310 A1 | 11/2008 | Aylward et al. |
| 2008/0315755 A1 | 12/2008 | Han |
| 2009/0001869 A1 | 1/2009 | Tanimoto et al. |
| 2009/0073350 A1 | 3/2009 | Toyama et al. |
| 2009/0086508 A1 | 4/2009 | Bierhuizen |
| 2009/0109656 A1 | 4/2009 | Chang |
| 2009/0128735 A1 | 5/2009 | Larson et al. |
| 2009/0242929 A1 | 10/2009 | Lin |
| 2009/0268428 A1 | 10/2009 | Tsukada |
| 2009/0296389 A1 | 12/2009 | Hsu |
| 2010/0061096 A1 | 3/2010 | Sato |
| 2010/0097809 A1 | 4/2010 | Munro et al. |
| 2010/0165635 A1 | 7/2010 | Chen et al. |
| 2010/0171215 A1 | 7/2010 | Fischer et al. |
| 2010/0172152 A1 | 7/2010 | Boonekamp |
| 2010/0195330 A1 | 8/2010 | Schaefer et al. |
| 2010/0207852 A1 | 8/2010 | Cok |
| 2010/0258543 A1 | 10/2010 | Mizuno et al. |
| 2010/0295762 A1 | 11/2010 | Yeom et al. |
| 2010/0317132 A1 | 12/2010 | Rogers et al. |
| 2011/0003410 A1 | 1/2011 | Tsay et al. |
| 2011/0018860 A1 | 1/2011 | Parry-Jones et al. |
| 2011/0038150 A1 | 2/2011 | Woodgate et al. |
| 2011/0090672 A1 | 4/2011 | Zhu et al. |
| 2011/0151602 A1 | 6/2011 | Speier |
| 2011/0194034 A1 | 8/2011 | Shimizu |
| 2011/0255303 A1 | 10/2011 | Nichol et al. |
| 2012/0086875 A1 | 4/2012 | Yokota |
| 2012/0119237 A1 | 5/2012 | Leatherdale et al. |
| 2012/0140462 A1 | 6/2012 | Pickard |
| 2012/0147296 A1 | 6/2012 | Montgomery et al. |
| 2012/0258963 A1 | 10/2012 | Berger et al. |
| 2012/0320627 A1 | 12/2012 | Araki et al. |
| 2013/0033849 A1 | 2/2013 | Roberts et al. |
| 2013/0039062 A1 | 2/2013 | Vinther et al. |
| 2013/0107525 A1 | 5/2013 | Woodgate et al. |
| 2013/0121000 A1 | 5/2013 | Lee et al. |
| 2013/0194812 A1 | 8/2013 | Tseng |
| 2013/0235580 A1 | 9/2013 | Smith |
| 2013/0258663 A1 | 10/2013 | Woodgate et al. |
| 2013/0293793 A1 | 11/2013 | Lu |
| 2014/0022619 A1 | 1/2014 | Woodgate et al. |
| 2014/0098418 A1 | 4/2014 | Lin |
| 2014/0140654 A1 | 5/2014 | Brown et al. |
| 2014/0186979 A1 | 7/2014 | Tu et al. |
| 2014/0211462 A1 | 7/2014 | Keller et al. |
| 2014/0211503 A1 | 7/2014 | Tarsa |
| 2014/0240828 A1 | 8/2014 | Robinson et al. |
| 2014/0240839 A1 | 8/2014 | Yang et al. |
| 2014/0299897 A1 | 10/2014 | Zhang et al. |
| 2014/0316742 A1 | 10/2014 | Sun et al. |
| 2015/0054011 A1 | 2/2015 | Koizumi et al. |
| 2015/0062490 A1 | 3/2015 | Kwon |
| 2015/0160396 A1 | 6/2015 | Wilcox et al. |
| 2015/0268479 A1 | 9/2015 | Woodgate et al. |
| 2015/0268513 A1 | 9/2015 | Chang et al. |
| 2015/0295154 A1 | 10/2015 | Tu et al. |
| 2015/0308635 A1 | 10/2015 | Li et al. |
| 2016/0018077 A1 | 1/2016 | Mallory et al. |
| 2016/0211413 A1 | 7/2016 | Park et al. |
| 2016/0299281 A1 | 10/2016 | Robinson et al. |
| 2017/0031085 A1 | 2/2017 | Lim et al. |
| 2017/0045666 A1 | 2/2017 | Vasylyev |
| 2017/0059127 A1 | 3/2017 | Jansma et al. |
| 2017/0102127 A1 | 4/2017 | Woodgate et al. |
| 2017/0139114 A1 | 5/2017 | Woodgate et al. |
| 2017/0154919 A1 | 6/2017 | Chen et al. |
| 2017/0161179 A1 | 6/2017 | Maple et al. |
| 2017/0205959 A1 | 7/2017 | Seong |
| 2017/0219883 A1 | 8/2017 | Yin |
| 2017/0248289 A1 | 8/2017 | Vasylyev |
| 2017/0261179 A1 | 9/2017 | Wu et al. |
| 2018/0014007 A1 | 1/2018 | Brown |
| 2018/0135831 A1 | 5/2018 | Smith et al. |
| 2018/0226384 A1 | 8/2018 | Park et al. |
| 2018/0321553 A1 | 11/2018 | Robinson et al. |
| 2019/0086706 A1 | 3/2019 | Robinson et al. |
| 2019/0139243 A1 | 5/2019 | You et al. |
| 2019/0215509 A1 | 7/2019 | Woodgate et al. |
| 2019/0220121 A1 | 7/2019 | Kim et al. |
| 2019/0250458 A1 | 8/2019 | Robinson et al. |
| 2019/0265478 A1 | 8/2019 | Cok et al. |
| 2019/0278135 A1 | 9/2019 | Woodgate et al. |
| 2019/0294004 A1 | 9/2019 | Hashimoto |
| 2019/0377067 A1 | 12/2019 | Han et al. |
| 2020/0049876 A1 | 2/2020 | Watanabe et al. |
| 2020/0096171 A1 | 3/2020 | Han et al. |
| 2020/0124834 A1 | 4/2020 | Woodgate et al. |
| 2020/0127169 A1* | 4/2020 | Ahmed .......... H01L 33/42 |
| 2020/0159055 A1 | 5/2020 | Robinson et al. |
| 2020/0166783 A1 | 5/2020 | Roy et al. |
| 2020/0259307 A1 | 8/2020 | Sharma et al. |
| 2020/0321553 A1 | 10/2020 | Kwon et al. |
| 2020/0355896 A1 | 11/2020 | Woodgate et al. |

FOREIGN PATENT DOCUMENTS

| | | |
|---|---|---|
| CN | 105556374 A | 5/2016 |
| CN | 105849595 A | 8/2016 |
| CN | 107402475 A | 11/2017 |
| DE | 102010031945 A1 | 1/2012 |
| EP | 1387412 A1 | 2/2004 |
| EP | 1835550 A2 | 9/2007 |
| EP | 1890343 A1 | 2/2008 |
| EP | 1986023 A1 | 10/2008 |
| EP | 2182783 A2 | 5/2010 |

(56) References Cited

FOREIGN PATENT DOCUMENTS

| | | | |
|---|---|---|---|
| EP | 2595295 | A1 | 5/2013 |
| GB | 2464102 | A | 4/2010 |
| GB | 2484711 | A | 4/2012 |
| JP | 2000323755 | A | 11/2000 |
| JP | 2007294411 | A | 11/2007 |
| JP | 2009295309 | A | 12/2009 |
| JP | 2010238846 | A | 10/2010 |
| JP | 2013219397 | A | 10/2013 |
| WO | 2007074932 | A1 | 7/2007 |
| WO | 2008109296 | A1 | 9/2008 |
| WO | 2010038025 | A2 | 4/2010 |
| WO | 2010038025 | A3 | 6/2010 |
| WO | 2011131200 | A1 | 10/2011 |
| WO | 2012052722 | A2 | 4/2012 |
| WO | 2012052723 | A1 | 4/2012 |
| WO | 2013064801 | A1 | 5/2013 |
| WO | 2013112435 | A1 | 8/2013 |
| WO | 2014043384 | A1 | 3/2014 |
| WO | 2015089517 | A1 | 6/2015 |
| WO | 2017007770 | A2 | 1/2017 |
| WO | 2018185475 | A1 | 10/2018 |
| WO | 2018185476 | A1 | 10/2018 |
| WO | 2018208618 | A1 | 11/2018 |
| WO | 2019067846 | A1 | 4/2019 |
| WO | 2019107826 | A1 | 6/2019 |

OTHER PUBLICATIONS

CN201980016364.X Notification of the First Office Action dated Dec. 27, 2021.
EP19804311.9—Extended European Search Report of the European Patent Office dated Dec. 15, 2021.
International search report and written opinion of international searching authority for PCT application PCT/US2020/050527 dated Feb. 3, 2021.
International search report and written opinion of international searching authority for PCT application PCT/US2020/053825 dated Dec. 30, 2020.
EP18200530.6—European Search Report of the European Patent Office dated May 23, 2019.
International search report and written opinion of international searching authority for PCT application PCT/GB2018/050893 dated Aug. 27, 2018.
International search report and written opinion of international searching authority for PCT application PCT/GB2018/050894 dated Aug. 27, 2018.
International search report and written opinion of international searching authority for PCT application PCT/GB2019/050076 dated May 9, 2019.
International search report and written opinion of international searching authority for PCT application PCT/US2019/021570 dated May 24, 2019.
International search report and written opinion of international searching authority for PCT application PCT/US2019/031526 dated Jul. 29, 2019.
International search report and written opinion of international searching authority for PCT application PCT/US2020/040686 dated Nov. 20, 2020.
International search report and written opinion of international searching authority for PCT application PCT/US2020/047383 dated Dec. 4, 2020.
International search report and written opinion of international searching authority for PCT application PCT/US2020/050460 dated Dec. 8, 2020.
International search report and written opinion of international searching authority for PCT application PCT/US2020/053864 dated Dec. 14, 2020.
PCT/US2022/034145 International search report and written opinion of the international searching authority dated Oct. 6, 2022.
CN201880036805.8 Notification of the First Office Action dated Jul. 23, 2021.
CN201880036842.9 Notification of the First Office Action dated Jul. 23, 2021.
International search report and written opinion of international searching authority for PCT application PCT/US2021/018544 dated Apr. 29, 2021.

* cited by examiner

ILLUMINATION APPARATUS COMPRISING PASSIVE OPTICAL NANOSTRUCTURES

TECHNICAL FIELD

This disclosure generally relates to modification of optical output from illumination devices and methods to manufacture illumination apparatuses including display apparatuses comprising passive optical nanostructures. Said illumination apparatuses may be used in applications such as environmental illumination or for image display.

BACKGROUND

In illumination apparatuses, passive optical structures (e.g. polarising elements, colour conversion elements etc.) are often incorporated to control the way the illumination apparatus provides light. One type of illumination apparatus is an illumination apparatus which uses micro-LEDs as the light-emitting elements. It tends to be difficult to manufacture appropriate passive optical structures which work well with light-emitting elements having the size of micro-LEDs.

BRIEF SUMMARY

According to the present disclosure, there is provided a method for manufacturing an illumination apparatus, the method comprising: forming a non-monolithic array of light-emitting elements; forming a first monolithic array of first passive optical nanostructures; selectively removing a plurality of first passive optical nanostructures from the first monolithic array in a manner that preserves the relative spatial position of the selectively removed first passive optical nanostructures, wherein the plurality of first passive optical nanostructures that are selectively removed from the first monolithic array are selected such that, in at least one direction, for at least one pair of the selectively removed first passive optical nanostructures in the at least one direction, for each respective pair there is at least one respective first passive optical nanostructure that is not selected that was positioned in the first monolithic array between the pair of selectively removed first passive optical nanostructures in the at least one direction; forming a first non-monolithic array of first passive optical nanostructures with the selectively removed first passive optical nanostructures in a manner that preserves the relative spatial position of the selectively removed first passive optical nanostructures; and aligning each of the first passive optical nanostructures of the first non-monolithic array of first passive optical nanostructures with a respective light-emitting element of the non-monolithic array of light-emitting elements.

Advantageously at least some of light emitting elements of an array of light-emitting elements may be provided with an aligned passive optical nanostructure. Increased optical function may be provided in very thin stacks. Alignment may be achieved for many light emitting elements and passive optical elements in a small number of steps, reducing cost and complexity. The size of the monolithic array may be smaller than the size of the illumination apparatus. The cost of equipment to provide the monolithic wafer may be reduced. Regions of the monolithic wafer between the aligned passive optical elements may be used for further alignment steps, increasing yield and reducing cost.

The non-monolithic array of light-emitting elements may be formed on a support substrate. Advantageously the light emitting elements may be provided to maintain dimensional stability and to provide control electrodes and electronics with low cost.

The method may further comprise sandwiching the non-monolithic array of light-emitting elements and the first non-monolithic array of first passive optical nanostructures between the support substrate and another substrate opposite to the support substrate, such that each first passive optical nanostructure is aligned with a respective light-emitting element. Advantageously the array of passive optical nanostructures and the array of light emitting elements may each be provided with high dimensional stability.

The method may further comprise transferring the first non-monolithic array of first passive optical nanostructures onto the other substrate prior to the sandwiching. Advantageously alignment may be achieved for many light emitting elements and passive optical elements in a small number of steps, reducing cost and complexity.

The method may further comprise transferring each of first passive optical nanostructures of the first non-monolithic array to a respective one of the light-emitting elements prior to the sandwiching. The alignment of the light-emitting elements and passive optical nanostructures may be maintained for substrates with different thermal expansions. The spacing between the light-emitting elements and passive optical nanostructures may be reduced, increasing coupling efficiency of the light from the light-emitting elements into the passive optical nanostructures.

The method may further comprise stacking each of the first passive optical nanostructures of the first non-monolithic array of passive optical nanostructures onto a respective light-emitting element of the non-monolithic array of light-emitting elements. Advantageously the nanostructures may be arranged to receive light from the light-emitting elements.

The method may further comprise measuring an optical or electrical characteristic of the first passive optical nanostructures for at least two regions of the first monolithic array; classifying the measurement of the optical or electrical characteristic for each region as being above or below a pre-determined measurement threshold for the optical or electrical characteristic; only selectively removing first passive optical nanostructures from regions for which the measurement of the optical or electrical characteristic is either above or alternatively below the pre-determined measurement threshold. Advantageously the performance of each transferred passive optical nanostructure is above a predetermined threshold. Device uniformity is increased and reworking costs are reduced. Only regions of the monolithic wafer comprising suitable passive optical elements may be used so that the tolerance for monolithic wafer uniformity is relaxed. Processing yield is increased and device cost is reduced. The uniformity of output of the illumination apparatus may be increased.

The method may further comprise providing a substrate that is transparent to light in an electromagnetic wavelength band; forming a release layer on the first substrate, wherein the release layer is configured to at least partially separate from the substrate when exposed to light in the electromagnetic wavelength band; forming the first monolithic array of first passive optical nanostructures on the release layer. Advantageously a substrate suitable for optical addressing during transfer may be provided.

Selectively removing the plurality of first passive optical nanostructures may comprise: illuminating with light in the electromagnetic wavelength band, through the substrate, regions of the release layer on which the selected plurality of first passive optical nanostructures are formed, thereby to at least partially separate the selected plurality of first passive optical nanostructures from the substrate. A controllable optical illumination system may be provided to select which of the passive optical nanostructures are separated. Advantageously controllable selection of transferred passive optical nanostructures may be achieved.

The illumination may at least partially separate the selected plurality of first passive optical nanostructures from the rest of the first monolithic array of first passive optical nanostructures. Only the desirable removed elements are separated in the transfer step. Advantageously transferred passive optical nanostructures may have high uniformity. Cost of transferred passive optical nanostructures is reduced and yield is increased.

The selected plurality of first passive optical nanostructures may be at least partially separated from the rest of the first monolithic array of first passive optical nanostructures by etching, scribing or ablation. Advantageously passive optical nanostructures may be provided with appropriate formed shapes and edge quality.

The illumination may comprise a plurality of shaped laser beams. Advantageously multiple passive optical nanostructures may be extracted with high processing speed, accuracy and efficiency. Cost may be reduced.

The electromagnetic wavelength band may be an ultraviolet wavelength band. Release layer bonds may be broken advantageously without damage to the passive optical nanostructures.

The illumination may dissociate a material of the release layer to form a gas. The light in the electromagnetic wavelength band may dissociate a layer of the material forming the first passive optical nanostructures. Uniform release of the passive optical nanostructure may be achieved, advantageously increasing reliability of extraction and reducing cost.

The method may comprise transferring the selectively removed plurality of first passive optical nanostructures onto a transfer member; and transferring each of the selectively removed plurality of first passive optical nanostructures from the transfer member onto a respective light-emitting element. Advantageously damage to the array of light-emitting elements during the transfer step may be reduced and yield increased. The transfer member may have a different rigidity to the monolithic array of first passive optical nanostructures and the support substrate for the respective light-emitting element. The transfer member may be provided with a material to achieve optimization of the alignment of the light-emitting element and respective passive optical element.

The method may comprise forming the monolithic array of passive optical nanostructures on a first substrate, wherein the first substrate is opaque to light in an electromagnetic wavelength band; transferring the monolithic array of passive optical nanostructures onto a second substrate, wherein the second substrate is transparent to light in the electromagnetic wavelength band; and illuminating the plurality of first passive optical nanostructures through the second substrate with light in the electromagnetic wavelength band, thereby to at least partially separate the plurality of passive optical nanostructures from the second substrate. Substrates suitable for forming high performance passive optical nanostructures may be provided and separate substrates suitable for selective transfer may be provided. Passive optical nanostructure growth or patterning and transfer performance may be separately tuned and passive optical nanostructure performance increased. Advantageously yield may be increased and cost reduced.

Selectively removing the plurality of first passive optical nanostructures may comprise adhering the plurality of first passive optical nanostructures to a first adhesive substrate in a manner that preserves the relative spatial position of the first passive optical nanostructures. The method may further comprise transferring the removed plurality of first passive optical nanostructures from the first adhesive substrate to a second adhesive substrate in a manner that preserves the relative spatial position of the selectively removed light-emitting elements; and transferring the first passive optical nanostructures from the second adhesive substrate to a support substrate in a manner that preserves the relative spatial position of the selectively removed light-emitting elements. Advantageously uniform alignment between the passive optical nanostructure and light-emitting element may be maintained during the transfer and alignment step.

Each of the first passive optical nanostructures may comprise a first surface and a second surface opposite the first surface, and wherein the first passive optical nanostructures are adhered to the first adhesive substrate such that their first surfaces are in contact with the first adhesive substrate and their second surfaces are exposed. The first passive optical nanostructures may be transferred to the second adhesive substrate such that their second surfaces are in contact with the second adhesive substrate and their first surfaces are exposed. The first passive optical nanostructures may be transferred to the support substrate such that their first surfaces are in contact with the support substrate and their second surfaces are exposed. The adhesive force between the first passive optical nanostructures and the second adhesive substrate may be greater than the adhesive force between first passive optical nanostructures and the first adhesive substrate. passive optical nanostructures may be arranged with optical input side arranged to receive light from the respective aligned light-emitting element. The adhesive force between the first passive optical nanostructures and the support substrate may be greater than the adhesive force between the first passive optical nanostructures and the second adhesive substrate. Advantageously optical performance may be increased.

The support substrate may be a planar substrate. Advantageously uniform optical output may be achieved. The substrates may be suitable for handling in semiconductor processing equipment. The substrates may be flexible.

Each of the light-emitting elements may be a micro-LED comprising a maximum dimension of at most 300 micrometers, preferably at most 200 micrometers and most preferably at most 100 micrometers. Advantageously high resolution arrays may be provided.

Each of the first passive optical nanostructures may have a maximum dimension of at most 400 micrometers, preferably at most 250 micrometers and most preferably at most 150 micrometers. A maximum dimension of each of the first passive optical nanostructures may be greater than or equal to a maximum dimension of a light-emitting area of a light-emitting element aligned with that first passive optical nanostructure. Advantageously the light from the light-emitting elements may be input into the passive optical nanostructures. The extent of the passive optical nanostructure may be reduced. Cross talk between adjacent elements may be reduced.

The first passive optical nanostructures comprise one or more sub-features with a maximum dimension of at most 5 micrometers, preferably at most 1 micrometers and most preferably at most 0.5 micrometers. Advantageously diffractive artefacts may be reduced or eliminated.

The first passive optical nanostructures comprise any one of the following types: wire grid polarisers; form birefringence retarders; quantum dot or quantum rod colour conversion structures; distributed Bragg reflectors; metamaterials; dichroic stacks; holograms; moth eye structures; nano-black materials; nano-collimators; air gap enclosing nanocolumns; photonic crystals.

The first passive optical nanostructures may be wire grid polarisers. Advantageously the output of the light emitting elements may be polarised with a polarisation state with a first electric vector transmission direction. Light of the orthogonal polarisation state may be scattered in the light emitting element and/or other passive optical nanostructures and may be recirculated as light with the first polarisation state. Efficiency may be increased. Such devices may be used to provide illumination with high efficiency for displays with an input polariser such as a liquid crystal display.

At least one of the wire grid polarisers may be aligned with its respective light-emitting element with a first orientation and at least one other wire grid polariser is aligned with its respective light-emitting element with a second orientation, the second orientation being orthogonal to the first orientation. Advantageously a stereoscopic display may be provided.

The first passive optical nanostructures may comprise form birefringence retarders. Advantageously optical retardance may be achieved to provide modification of polarisation output. Recirculation efficiency may be increased in polarisation output devices. Circular output polarisation may be provided for stereoscopic display to provide head tilt for users with circular analyser eyewear.

The first passive optical nanostructures may comprise distributed Bragg reflectors. Advantageously the spectral output of the illumination apparatus may be modified.

The first passive optical nanostructures may comprise metamaterials. Advantageously the refractive index properties of the illumination apparatus may be modified.

The first passive optical nanostructures may comprise dichroic stacks. Advantageously the spectral output properties of the illumination apparatus may be modified.

The first passive optical nanostructures may comprise holograms. Advantageously the directional output properties of the illumination apparatus may be modified.

The first passive optical nanostructures may comprise moth eye structures. The first passive optical nanostructures may comprise nano-black materials. Advantageously the reflectivity of the illumination apparatus may be reduced and contrast improved.

The first passive optical nanostructures may comprise nano-collimators. Advantageously the directionality of the optical output may be modified. A privacy illumination apparatus may be provided.

The first passive optical nanostructures may comprise air gap enclosing nanocolumns. Advantageously the illumination apparatus may be bonded to another substrate, providing increased dimensional stability. The output may be coupled into an optical apparatus within the critical angle, increasing coupling efficiency and reducing stray light.

The first passive optical nanostructures may comprise photonic crystals. Advantageously the spectral and/or directional output may be modified to provide increased functionality.

The colour conversion structures may be photoluminescent. The first passive optical nanostructures may be quantum dot or quantum rod colour conversion structures. Advantageously high colour conversion efficiency may be achieved. Spectral bandwidth may be controlled.

At least one of the light-emitting elements of the non-monolithic array of light-emitting elements may not have a quantum dot or quantum rod colour conversion structure aligned therewith. Advantageously output efficiency is increased in at least one wavelength band.

The method may further comprise forming a second monolithic array of second passive optical nanostructures; selectively removing a plurality of second passive optical nanostructures from the second monolithic array in a manner that preserves the relative spatial position of the selectively removed second passive optical nanostructures, wherein the plurality of second passive optical nanostructures that are selectively removed from the second monolithic array are selected such that, in at least one direction, for at least one pair of the selectively removed second passive optical nanostructures in the at least one direction, for each respective pair there is at least one respective second passive optical nanostructure that is not selected that was positioned in the second monolithic array between the pair of selectively removed second passive optical nanostructures in the at least one direction; forming a second non-monolithic array of second passive optical nanostructures with the selectively removed second passive optical nanostructures in a manner that preserves the relative spatial position of the selectively removed second passive optical nanostructures; and aligning each of the second passive optical nanostructures of the second non-monolithic array of second passive optical nanostructures with a respective light-emitting element of the non-monolithic array of light-emitting elements. Advantageously further modification of optical output of the light-emitting element and aligned passive optical nanostructure may be achieved.

The first passive optical nanostructures may be a different type of passive optical nanostructure to the second passive optical nanostructures. The first monolithic array of first passive optical nanostructures may be formed separately to the second monolithic array of second passive optical nanostructures. The method may further comprise stacking each second passive optical nanostructures of the second non-monolithic array of passive optical nanostructures onto either a respective light-emitting element or a respective first passive optical nanostructure. Advantageously multiple optical modifications may be achieved in very low optical thicknesses and at low cost.

At least one of the light-emitting elements with a first passive optical nanostructure aligned therewith may not have a second passive optical nanostructure aligned therewith; and/or at least one of the light-emitting elements with a second passive optical nanostructure aligned therewith may not have a first passive optical nanostructure aligned therewith. Advantageously the output across the array of light-emitting elements may be modified to provide different performance for different light-emitting elements, for example colour, polarisation state, and emission light cone solid angle.

The non-monolithic array of light-emitting elements may be formed by: forming a monolithic array of light-emitting elements; selectively removing a plurality of light-emitting elements from the monolithic array in a manner that preserves the relative spatial position of the selectively removed light-emitting elements, wherein the plurality of light-emitting elements that are selectively removed from the first monolithic array are selected such that, in at least one direction, for at least one pair of the selectively removed light-emitting elements in the at least one direction, for each respective pair there is at least one respective light-emitting elements that is not selected that was positioned in the first monolithic array between the pair of selectively removed light-emitting elements in the at least one direction; forming the non-monolithic array of light-emitting elements with the selectively removed light-emitting elements in a manner that preserves the relative spatial position of the selectively removed light-emitting elements. Advantageously a low cost array of sparsely separated light-emitting elements may be provided with low cost and high efficiency.

The method may further comprise forming an illumination apparatus with the aligned first non-monolithic array of first passive optical nanostructures and the non-monolithic array of light-emitting elements. Advantageously the optical functionality of the illumination apparatus is greater than that that may be achieved by the array of light-emitting elements alone, and with high efficiency and uniformity in a thin structure.

The method may further comprise forming a display apparatus with the illumination apparatus. Advantageously displays with high efficiency, low cost and low thickness may be provided with optical output that may be arranged to achieve at least some of colour display, stereoscopic display, privacy display, low stray light display. The displays may be flexible and bendable.

According to a second aspect of the present disclosure there is provided an illumination apparatus that may comprise a non-monolithic array of light-emitting elements; and a non-monolithic array of passive optical nanostructures from a monolithic array of passive optical nanostructures, wherein: each of the passive optical nanostructures is aligned with a respective light-emitting element of the non-monolithic array of light-emitting elements, the passive optical nanostructures of the non-monolithic array of passive optical nanostructures are arranged with their original positions relative to each other in the monolithic array preserved, and wherein in at least one direction, for at least one pair of the passive optical nanostructures of the non-monolithic array in the at least one direction, for each respective pair there was at least one respective passive optical nanostructure in the monolithic array of passive optical nanostructures that was positioned in the monolithic array of passive optical nanostructures between the pair of passive optical nanostructures in the at least one direction and that is not positioned between them in the non-monolithic array of passive optical nanostructures.

The illumination apparatus may be a backlight for a transmissive spatial light modulator. Advantageously a privacy backlight may be achieved. The nanostructures may be arranged to provide conversion of blue light to multiple spectral bands to provide white light. The backlight may have high efficiency and be arranged in a thin package. Privacy display illumination may be provided.

The illumination apparatus may further comprise a control system arranged to provide the light-emitting elements with image data. The light-emitting elements may be addressable and driven as pixels. Advantageously high dynamic range operation may be achieved when the illumination apparatus is arranged for use in a backlight.

According to a third aspect of the present disclosure there is provided a display apparatus comprising the illumination apparatus of the second aspect. Advantageously very low thickness may be achieved with high quality optical output and at low cost.

Any of the aspects of the present disclosure may be applied in any combination.

Embodiments of the present disclosure may be used in a variety of optical systems. The embodiments may include or work with a variety of projectors, projection systems, optical components, displays, microdisplays, computer systems, processors, self-contained projector systems, visual and/or audio-visual systems and electrical and/or optical devices. Aspects of the present disclosure may be used with practically any apparatus related to optical and electrical devices, optical systems, presentation systems or any apparatus that may contain any type of optical system. Accordingly, embodiments of the present disclosure may be employed in optical systems, devices used in visual and/or optical presentations, visual peripherals and so on and in a number of computing environments.

Before proceeding to the disclosed embodiments in detail, it should be understood that the disclosure is not limited in its application or creation to the details of the particular arrangements shown, because the disclosure is capable of other embodiments. Moreover, aspects of the disclosure may be set forth in different combinations and arrangements to define embodiments unique in their own right. Also, the terminology used herein is for the purpose of description and not of limitation.

These and other advantages and features of the present disclosure will become apparent to those of ordinary skill in the art upon reading this disclosure in its entirety.

BRIEF DESCRIPTION OF THE DRAWINGS

Embodiments are illustrated by way of example in the accompanying FIGURES, in which like reference numbers indicate similar parts, and in which.

DETAILED DESCRIPTION

Figure 1:
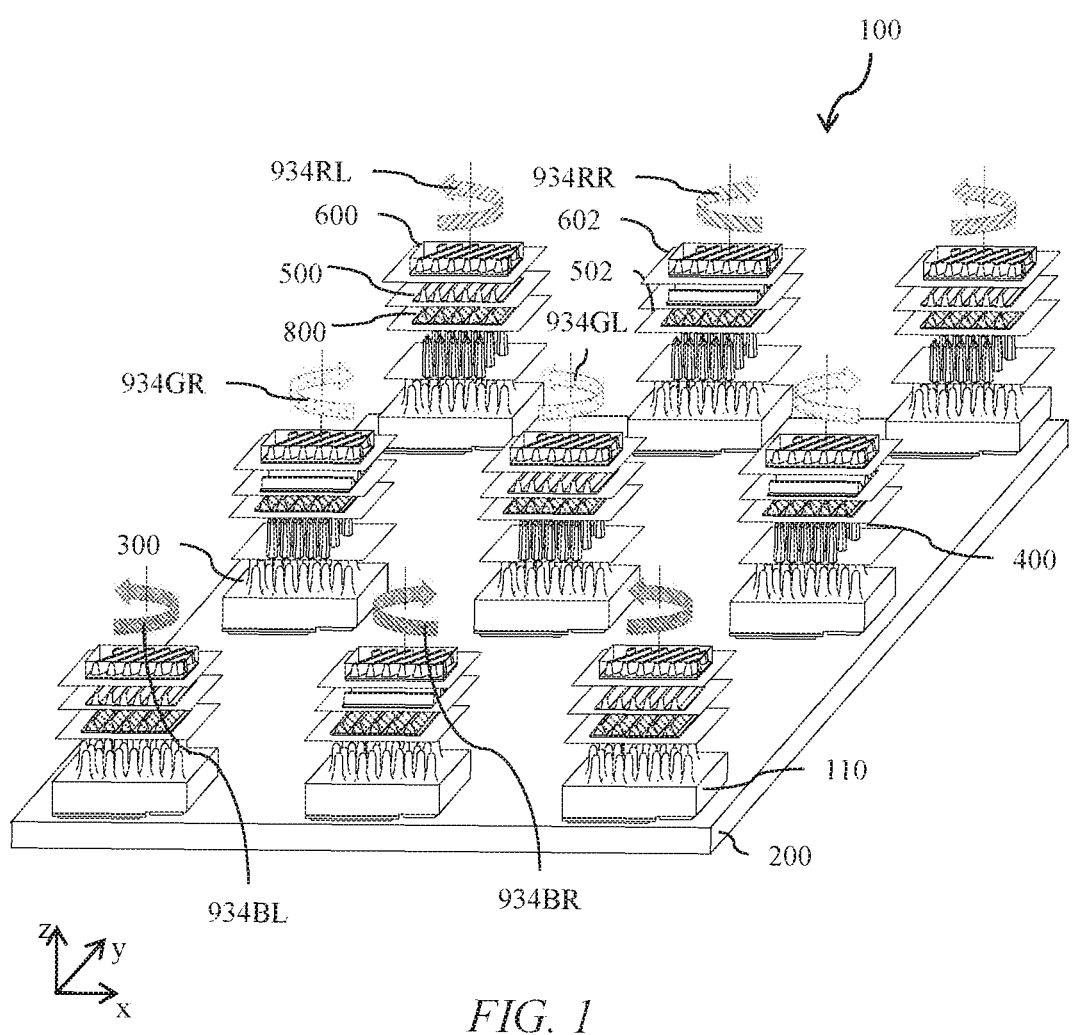
FIG. 1 is a schematic diagram illustrating part of the structure of an illumination apparatus.

In this specification, (except when qualified by the term "packaged"), "LED" or "micro-LED" refers to an unpackaged LED die chip extracted directly from a monolithic wafer, i.e. a semiconductor element. Micro-LEDs may be formed by array extraction methods in which multiple LEDs are removed from a monolithic epitaxial wafer in parallel and may be arranged with positional tolerances that are less than 5 micrometres. This is different from packaged LEDs. Packaged LEDs typically have a lead-frame and plastic or ceramic package with solder terminals suitable for standard surface-mount PCB (printed circuit board) assembly. The size of the packaged LEDs and limits of PCB assembly techniques means that displays formed from packaged LEDs are difficult to assemble with pixel pitches below about 1 mm. The accuracy of components placed by such assembly machines is typically about plus or minus 30 micrometres. Such sizes and tolerances prevent application to very high-resolution displays.

The structure and operation of various directional display devices will now be described. In this description, common elements have common reference numerals. It is noted that the disclosure relating to any element applies to each device in which the same or corresponding element is provided. Accordingly, for brevity such disclosure is not repeated.

FIG. 1 is a schematic diagram illustrating part of the structure of an illumination apparatus 100 according to an embodiment. The illumination apparatus 100 may be any type of illumination apparatus, for example an emissive light modulator, a backlight for a transmissive spatial light modulator or an environmental illumination apparatus. The illumination apparatus 100 may form part of a display apparatus such as a computer monitor, television or other type of display.

The illumination apparatus 100 comprises a planar support substrate 200. The support substrate may be planar substrate and may be flexible or rigid.

A non-monolithic array of LEDs 110 and a plurality of different types of passive optical nanostructures 300, 400, 500, 600, 800 are arranged on the support substrate 200. The support substrate 200 constitutes a backplane on which the LEDs 110 are mounted and attached. The LEDs 110 are micro-LEDs, i.e. LEDs with a maximum dimension of at most 300 micrometres (although preferably the maximum dimension of each LED 110 is at most 200 micrometres, and most preferably at most 100 micrometres). Each LED 110 of the dimensions above may comprise a single emission region or may also comprise a plurality of emission regions that are provided by electrode arrangements or may comprise an array of nano-emitters for example a quantum rod emitter.

Each passive optical nanostructure 300, 400, 500, 600, 800 is aligned with and stacked on a respective LED 110 such that each LED 110 has a plurality of different types of passive optical nanostructures stacked thereon. In this way, a non-monolithic array of each type of passive optical nanostructure 300, 400, 500, 600, 800 is formed on top of the non-monolithic array of LEDs 110. The passive optical nanostructures 300, 400, 500, 600, 800 each have a maximum dimension of at most 400 micrometres (although preferably the maximum dimension of each passive optical nanostructure is at most 250 micrometres and most preferably at most 150 micrometres). The maximum dimension of each of the passive optical nanostructures 300, 400, 500, 600, 800 is greater than or equal to the maximum dimension of a light-emitting area of each of the LEDs 110.

The passive optical nanostructures may each comprise one or more sub-features with a maximum dimension of at most 5 micrometres (although preferably the maximum dimension of each sub-feature is at most 1 micrometres and most preferably at most 0.5 micrometres). Examples of sub-features include but are not limited to electrically conductive ridges, quantum rods, quantum dots, columnar dielectric structures, elongate dielectric structures, columnar nano-black structures, and holographic refractive index patterned structures.

At least one of the LEDs 110 has the same combination of types of passive optical nanostructures stacked thereon to another one of the LEDs 110. However, not all of the LEDs 110 have the same combination of types of passive optical nanostructures stacked thereon. In other words, at least one of the LEDs 110 has a different combination of types of passive optical nanostructures stacked thereon to at least another one of the LEDs 110. The passive optical nanostructures 300, 400, 500, 600, 800 act to manipulate and/or change the characteristics of the light output by the LEDs 110, such that the light output by each LED 110 has particular desired characteristics after travelling through the passive optical nanostructures stacked on the LED 110. The particular desired characteristics depend on the combination of types of passive optical nanostructures that the light has travelled through. For example, as illustrated by reference numerals 934BL, 934BR, 934GR, 934GL, 934RL and 934RR, the light may have different states of circular polarisation (i.e. right-handed or left-handed) and colour (e.g. red, blue or green) depending on the combination of types of passive optical nanostructure that it has travelled through. Some of the LEDs 110 may provide other visible light wavelength bands or may be infra-red (IR) or ultra-violet (UV) emitters.

The different types of passive optical nanostructures 300, 400, 500, 600, 800 include moth eye structures 300, quantum rod structures 400, wire grid polarisers 500, form birefringence retarders 600 and collimating nanostructures 800, which will be described in more detail below with reference to FIG. 2.

Although not shown, it will be appreciated that the illumination apparatus may comprise other components, such as a control system for addressing and driving the LEDs as pixels using image data. Such control system may comprise circuitry at the edge of the substrate 200 or within the array of LEDs, or a combination of the two.

Figure 2:
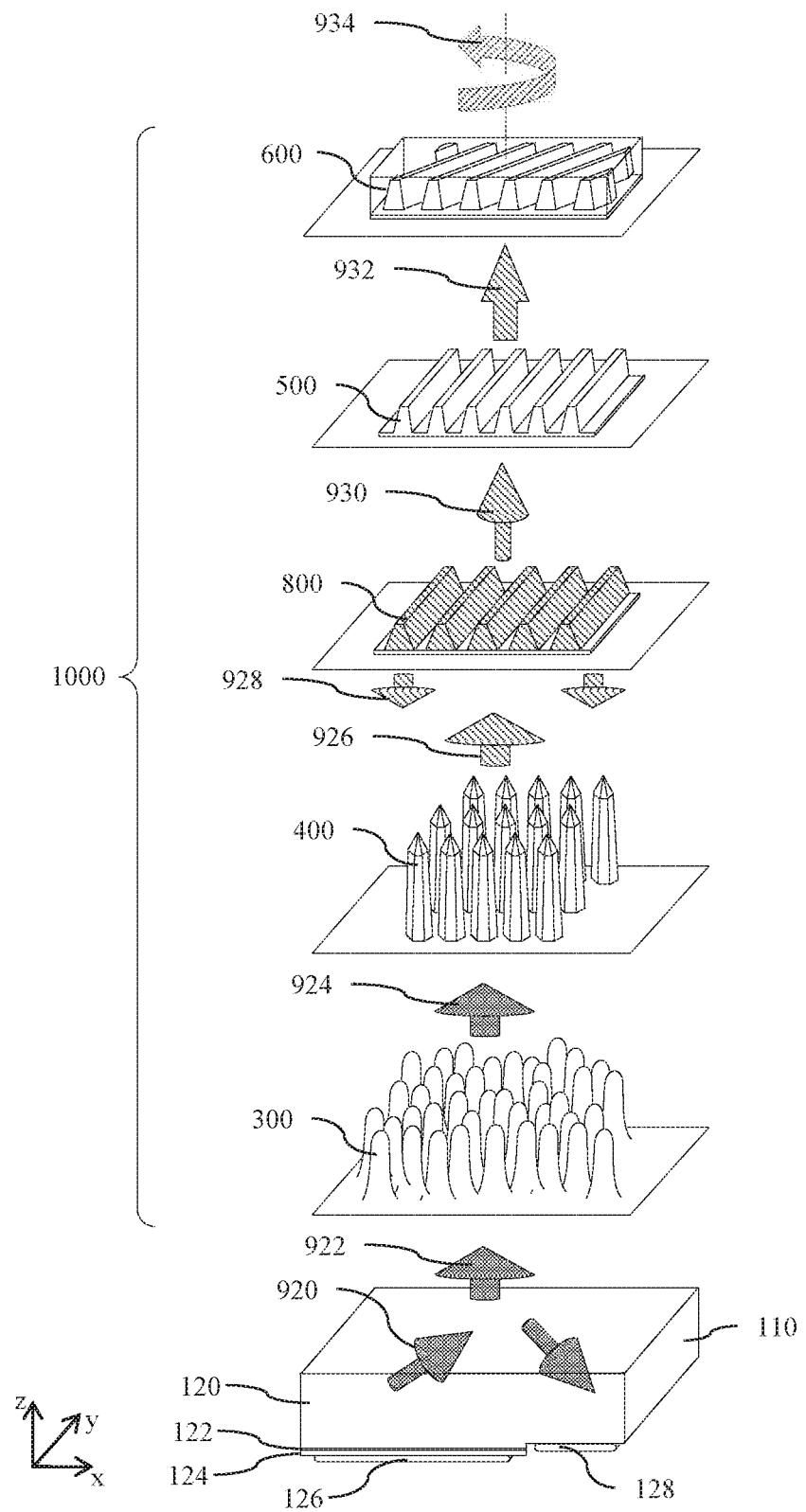
FIG. 2 is a schematic diagram illustrating an example of a combination of different types of passive optical nanostructure that may be stacked on an LED.

FIG. 2 is a schematic diagram illustrating an example of a combination of different types of passive optical nanostructure that may be stacked on an LED 110 in the illumination apparatus 100 of FIG. 1. Features of the embodiment of FIG. 2 not discussed in further detail may be assumed to correspond to the features with equivalent reference numerals as discussed above, including any potential variations in the features.

In this example, from bottom to top order, the stack comprises an LED 110, a moth eye structure 300, a quantum rod structure 400, a collimating nanostructure 800, a wire grid polariser 500 and a form birefringence retarder 600. The LED 110 is configured to emit light 922 (e.g. unpolarised Lambertian blue light) towards the moth eye structure 300.

The moth eye structure 300 is configured to receive the light 922 emitted by the LED 110. The moth-eye structure provides a refractive index gradient at the output of the LED and advantageously improves the extraction of light from the LED 110.

The moth eye structure 300 is configured to output light 924 towards the quantum rod structure 400. The quantum rod structure 400 is configured to receive the light 924 from the moth eye structure 300 and convert the colour of the light 924 (e.g. by a photoluminescent colour conversion mechanism). The quantum rod structure 400 is configured to output the colour converted light 926 towards the collimating nanostructure 800. The collimating nanostructure 800 is configured to receive the colour converted light 926 from the quantum rod structure 400 and collimate at least some of the colour converted light 926. At least some of the light received by the collimating nanostructure 800 is reflected back by the optical collimating design, which may for example be micro prisms, towards the quantum rod structure 400 and is recycled. Advantageously the efficiency of light output is increased.

The collimating nanostructure 800 is configured to output the collimated light 930 towards the wire grid polariser 500. The wire grid polariser 500 is configured to receive the collimated light 930 from the collimating nanostructure 800 and linearly polarise the light in a particular polarisation state. The wire grid polariser 500 is configured to output the linearly polarised light 932 towards the form birefringence retarder 600. The form birefringence retarder 600 is configured to receive the linearly polarised light 932 from the wire grid polariser 500 and convert the linearly polarised light into circularly polarised light. The state of circular polarisation depends on the direction of the linear polarisation caused by the wire grid polariser 500. The form birefringence retarder 600 is configured to output the circularly polarised light for use by the illumination apparatus 100 for illumination.

It will be appreciated that the passive optical nanostructures illustrated by FIGS. 1 and 2 are not the only types envisaged. Other types of passive optical nanostructures such as quantum dot colour conversion structures, Fabry Perot resonator structures containing an IGZO layer for selective colour reflection, distributed Bragg reflectors, metamaterials, dichroic stacks, holograms, nano-black materials, air gap enclosing nanocolumns, and photonic crystals may be stacked on the LEDs 110 in addition to or instead of any of the ones described with reference to FIG. 1 and FIG. 2.

By way of comparison with the present embodiments, the growth of stacks of nanostructure layers grown directly onto the micro-LEDs on the monolithic LED wafer will now be considered. The process growth conditions for each nanostructure may be incompatible or damage the already deposited layers. In addition, each nanostructure growth will have a yield of good devices. When the various nanostructure growth processes are completed the overall yield loss is the sum of the individual yield losses and so can be very low for the illumination devices themselves.

In the present embodiments, each nanostructure layer growth and fabrication can be individually optimized. Only good nanostructure elements are transferred so that advantageously the overall device yield is improved and optical performance is improved.

The transfer from each nanostructure substrate may be in parallel so that many elements may be aligned in a single step. As alignment at micron scale is needed this reduction in alignment steps advantageously achieves a substantial cost reduction.

Further, for illumination apparatuses which use micro-LEDs, stacks of passive optical nanostructures tend to be desirable compared to conventional larger scale optical structures, due to the small size of the micro-LEDs which makes it difficult to combine micro-LEDs with said conventional larger scale optical structures. However, stacks of passive optical nanostructures tend to be difficult to manufacture. For example, the growth of stacks of nanostructures tends to suffer from the problems of overgrowth, lack of sufficient seed substrate surface quality and low wafer uniformity, which tends to result in very low yield. A method of manufacturing stacks of passive optical nanostructures which may avoid and/or address the above problems will now be described.

Figure 3:
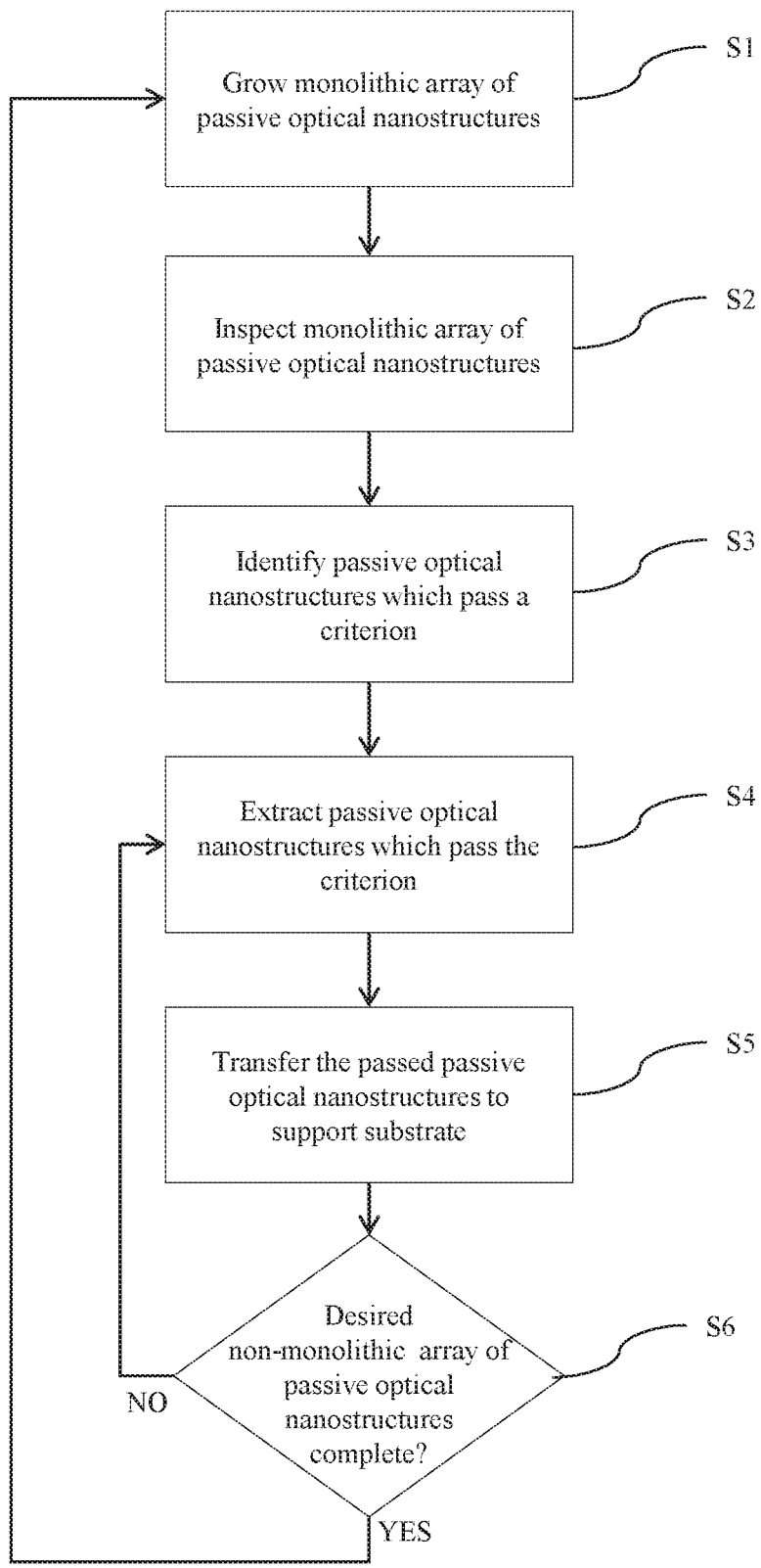
FIG. 3 is a flowchart illustrating the steps of a method of manufacturing passive optical nanostructures.

FIG. 3 is a flowchart illustrating the steps of a method of manufacturing passive optical nanostructures for use in illumination apparatuses such as the illumination apparatus 100 of FIG. 1.

In step S1, a monolithic array of a single type of passive optical nanostructures is grown on a growth substrate. The passive optical nanostructures may be any appropriate type of passive optical nanostructure, including but not limited to: wire grid polarisers, form birefringence retarders, quantum dot or quantum rod colour conversion structures, distributed Bragg reflectors, metamaterials, dichroic stacks, holograms, moth eye structures, nano-black materials, nano-collimators, air gap enclosing nanocolumns, photonic crystals. The growth substrate may undergo further processing such as etching in order to define the individual size of the optical nanostructures.

In step S2, the monolithic array is inspected. For example, an optical or electrical characteristic of the passive optical nanostructures may be measured for a plurality of different regions of the monolithic array of passive optical nanostructures as part of the inspection. Optical characteristics may include but are not limited to reflectivity, transmission, spectral properties, retardance, photoluminescence and polarisation extinction. Electrical characteristics may include but are not limited to conductivity.

The inspection may further identify defect particles, scratches, and uniformity of characteristics across the monolithic array.

In step S3, based on the inspection performed in step S2, passive optical nanostructures which pass and/or fail a pre-determined criterion are identified. In more detail, passive optical nanostructures which are above a pre-determined measurement threshold for an optical or electrical characteristic are classified as passing the criterion, and passive optical nanostructures which are below the pre-determined measurement threshold for an optical or electrical characteristic are classified as failing the criterion, or vice versa. The purpose of the inspection is to identity known-good devices before their subsequent transfer.

In step S4, a selection of passive optical nanostructures which pass the criterion are extracted/removed from the monolithic array. The extraction/removal is selective in the sense that one or more passive optical nanostructures which pass the criterion are not selected for extraction/removal. The one or more passive optical nanostructures which pass the criterion but are not selected for extraction/removal may be located between passive optical nanostructures which are selected for extraction/removal. The selected passive optical nanostructures are extracted/removed from the monolithic array in a manner that preserves their relative spatial position. In this way, the selected passive optical nanostructures are extracted/removed such that their relative spacing is unchanged. A sparse array may be extracted at a pitch to match the LEDs 110. The alignment of the selected nanostructures to the LEDs 110 may be provided in a single step.

In step S5, the removed passive optical nanostructures are transferred to a support substrate. More specifically, each of the removed passive optical nanostructures is transferred onto a respective LED on the support substrate. The removed passive optical nanostructures are transferred in a manner that preserves the relative spatial position of the removed passive optical nanostructures. In this way, the relative spatial position of the passive optical nanostructures in the initial monolithic array is preserved even after the passive optical structures are on the support substrate. This preservation of spatial position tends to enable the placing of the passive optical nanostructures with high precision on the support substrate.

In step S6, it is determined whether or not a desired non-monolithic array of the passive optical nanostructures has been completed. If the desired array is not complete, the method returns to step S4 and extracts more passive optical nanostructures which pass the criterion and transfers them to the support substrate. If the desired non-monolithic array of the passive optical nanostructures is complete, the method returns to step S1 and repeats but with a different type of passive optical nanostructure.

Method steps S1 to S6 are sequentially repeated with different types of passive optical nanostructure until all desired non-monolithic arrays of different types of passive optical nanostructures have been formed and stacked onto the support substrate. In this way, a stack of different types of passive optical nanostructures, e.g. as illustrated in FIGS. 1 and 2, is created for each LED. It will be appreciated that the same or different combinations of types of passive optical nanostructures may be stacked on different LEDs and, in general, each LED may have any combination of types of passive optical nanostructure stacked thereon in any order according to desire.

Figure 4:
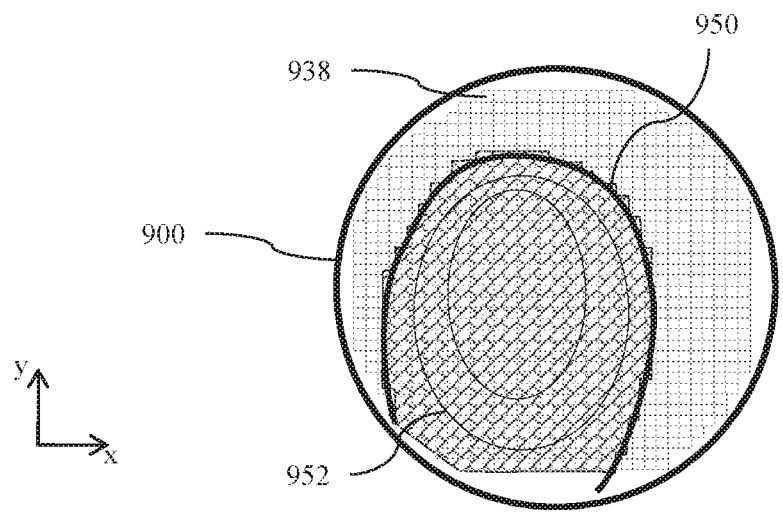
FIGS. 4-5 are schematic diagrams illustrating the identification of passive optical nanostructures which pass or fail a criterion.
Figure 5:
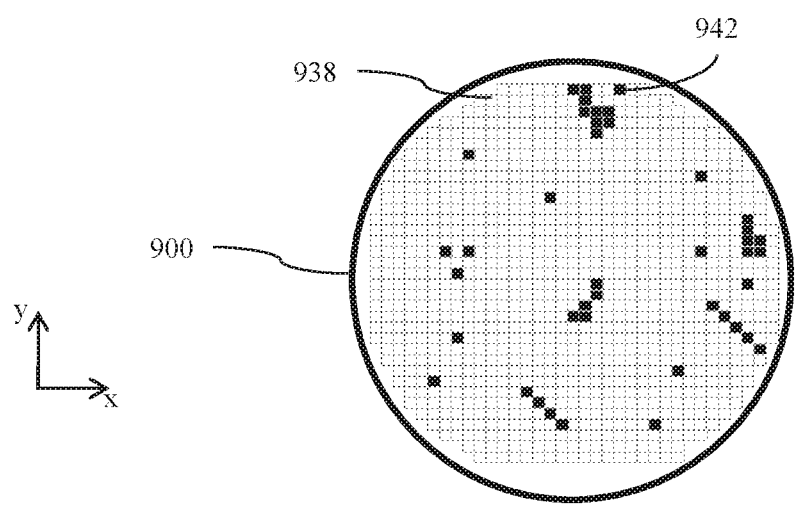

FIGS. 4-5 are schematic diagrams further illustrating steps S2 and S3 of the method of FIG. 3. FIG. 4 is a schematic diagram illustrating an example of a region 950 of passive optical nanostructures 938 of a monolithic array 900 of passive optical nanostructures. Features of the embodiment of FIGS. 4-5 not discussed in further detail may be assumed to correspond to the features with equivalent reference numerals as discussed above, including any potential variations in the features.

FIG. 4 illustrates the variation of measured characteristics across the wafer 900. Passive optical nanostructures 30 are grown or deposited in a monolithic array 900. Variations in process conditions across the wafer 900 may provide variations in optical or electrical characteristics that may be divided into individual performance regions as illustrated in FIG. 4. Different regions of the wafer may fall within different characteristic groups. For example all those items within contour 950 may be within a first target characteristic group and all those in regions 940 may be outside the target characteristic group. Within each characteristic group 950, the passive optical nanostructures may be divided into bins of performance. In an illustrative example, the passive optical nanostructure (PON) may be a reflective wire-grid polariser passive optical nanostructure. Characteristic group outside contour 950 may have polarisation extinction ratio less than 20:1, passive optical nanostructures 938 may be rejected and not transferred. Within the contour 950, the elements may be divided into bins by contours, for example 20:1 to 25:1, and 25:1 to 30:1 extinction ratio. Advantageously below performance PONs 938 are not transferred and device performance is increased.

By way of comparison with the present embodiments, in a monolithic transfer scheme the whole of both the active LED wafer and the passive optical nanostructure wafer is lost outside the contour 950. Advantageously the present embodiments achieve reduced cost.

It may be further desirable to not transfer passive optical nanostructures in the regions of defects and scratches and non-operable passive optical nanostructures.

FIG. 5 is a schematic diagram illustrating a plurality of passive optical nanostructures of the monolithic array 900. In this case those illustrated by squares 942 fail the criterion, which for example may be transmission of light above a certain threshold value. The other passive optical nanostructures 938 pass this criterion. Failed devices are identified and only known good dies are transferred. Advantageously the yield of the final illumination device may be improved.

Figure 6A:
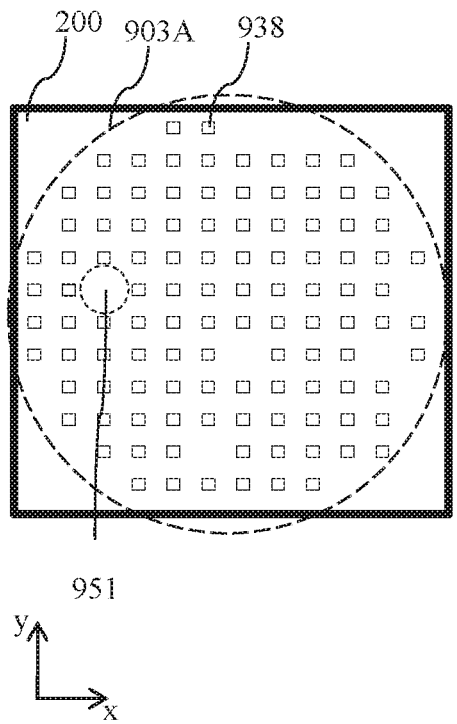
FIGS. 6A-C are schematic diagrams illustrating the completion of an array of passive optical nanostructures.
Figure 6B:
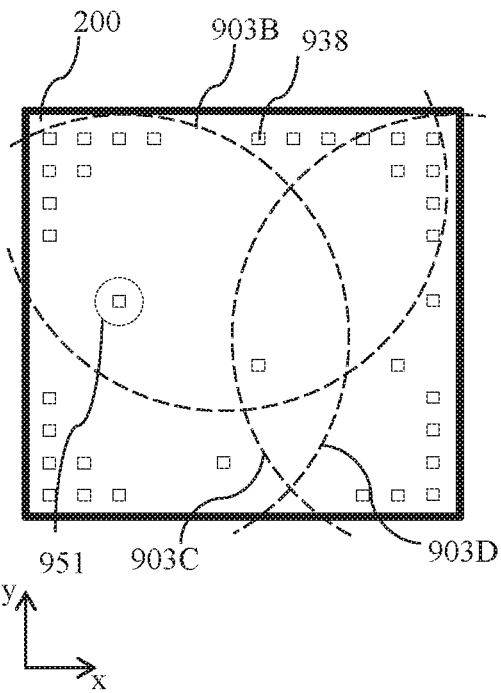
Figure 6C:
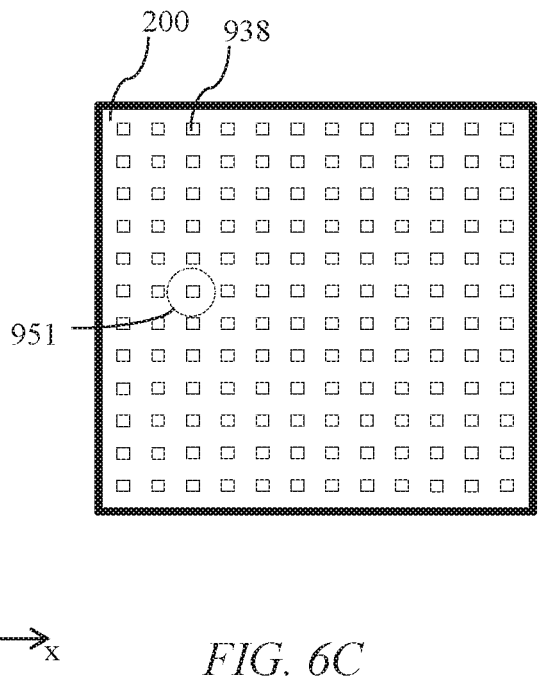

FIGS. 6A-C are schematic diagrams further illustrating step S6 of FIG. 3. More specifically, these figures illustrate the process of completing the desired non-monolithic array of passive optical nanostructures by filling in any gaps where a passive optical nanostructure is desired but was not transferred over from the monolithic array. Features of the embodiments of FIGS. 6A-C not discussed in further detail may be assumed to correspond to the features with equivalent reference numerals as discussed above, including any potential variations in the features.

FIG. 6A illustrates a support substrate 200 upon which an array of passed optical elements within the characteristic group 950 of FIG. 4 and passed passive optical nanostructures 938 of FIG. 5 are transferred in a first transfer step. The wafer placement boundary 903A illustrates the extent of the monolithic wafer of the passive optical nanostructure and missing element 951 illustrates a non-transferred location.

FIG. 6B illustrates the transferred passive optical nanostructures 938 in at least one subsequent transfer step from multiple wafer placements illustrated by wafer placement boundaries 903B, 903C and 903D. Advantageously the support substrate 200 is filled with devices.

FIG. 6C illustrates the assembled support substrate 200 with a complete set of passed passive optical nanostructures 938. Advantageously high uniformity and reliability may be achieved.

The extraction of the array of passive optical nanostructures 938 will now be described.

FIGS. 7A-I are schematic diagrams illustrating steps S1, S4 and S5 of the method of FIG. 3. Features of the embodiments of FIGS. 7A-I not discussed in further detail may be assumed to correspond to the features with equivalent reference numerals as discussed above, including any potential variations in the features.

Figure 7A:
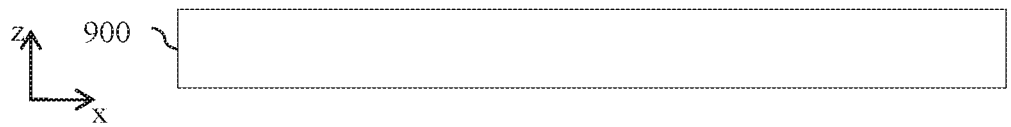
FIGS. 7A-I are schematic diagrams illustrating various steps of the method of manufacturing passive optical nanostructures of FIG. 3.

First, as illustrated by FIG. 7A, a growth substrate 900 is provided. The growth substrate 900 is transparent to light in a particular electromagnetic wavelength band. The growth substrate 900 may for example be formed from sapphire and transparent to UV light.

Figure 7B:
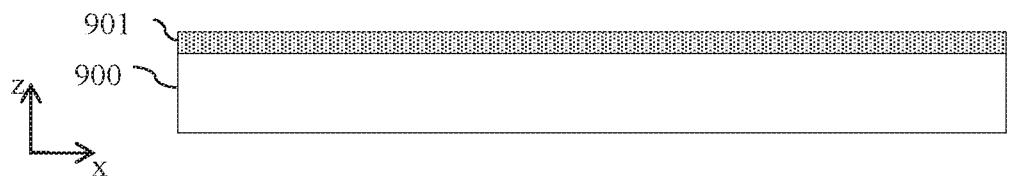

Then, as illustrated by FIG. 7B, a release layer 901 is formed on the growth substrate 900. The release layer 901 may be formed from undoped gallium nitride (e.g. U-GaN). The release process may comprise use of short duration laser pulses in order to promote an ablative process without causing thermal damage to adjacent materials. Or alternatively may be another material with optical release layer properties such as polyimide. Alternatively the layer may be a release layer that can be removed by an etching or thermal process.

Figure 7C:
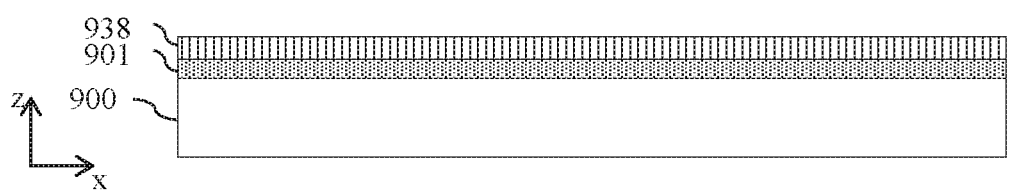

Then, as illustrated by FIG. 7C, a monolithic array of passive optical nanostructures 938 is formed (e.g. grown) on the release layer 901.

Figure 7D:
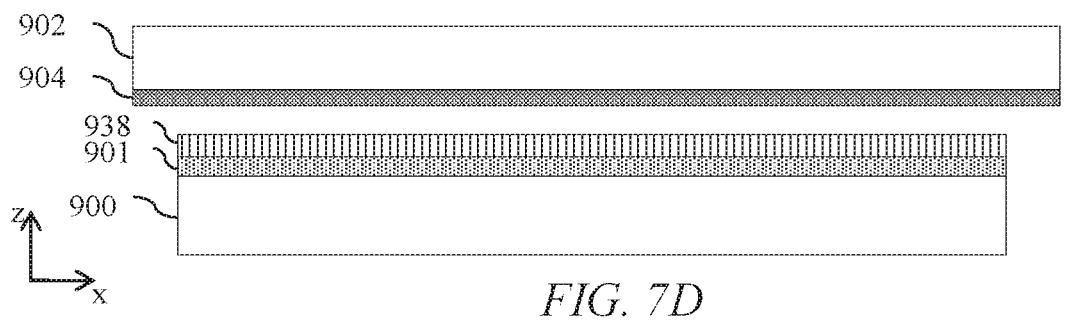

Then, as illustrated by FIG. 7D, a transfer member 902 with an adhesive layer 904 formed thereon is provided.

Figure 7E:
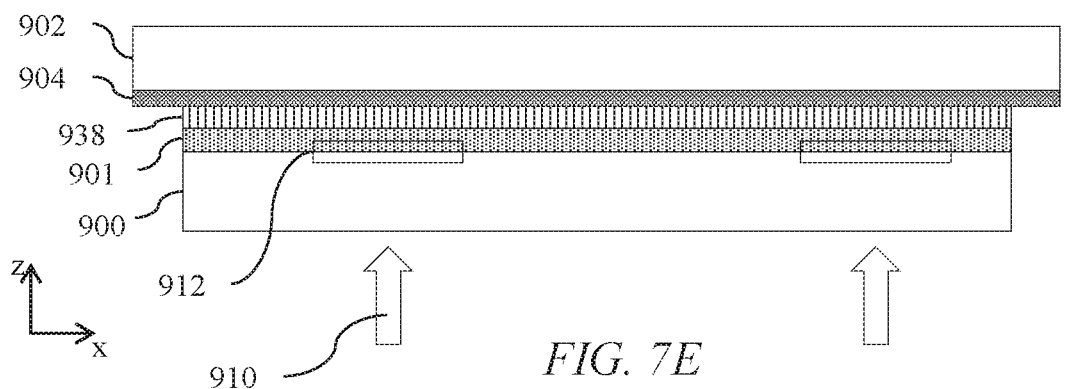

As illustrated by FIG. 7E, the transfer member 902 is then adhered to the monolithic array of passive optical nanostructures 938 using the adhesive layer 904. In addition, regions 912 of the release layer 901 corresponding to selected passed passive optical nanostructures 938 are illuminated, through the growth substrate 900, with light in the particular electromagnetic wavelength band to which the growth substrate 900 is transparent. The illumination may comprise a plurality of shaped laser beams.

Figure 7F:
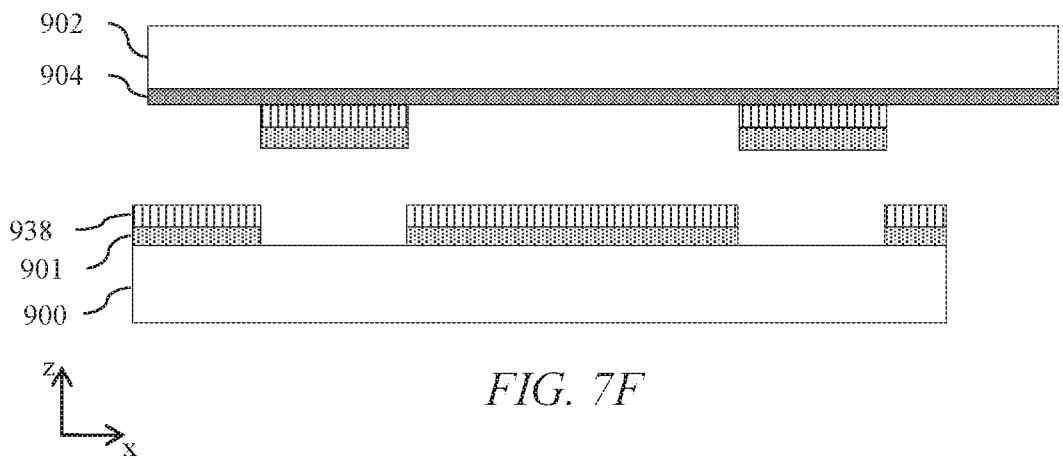

As illustrated by FIG. 7F, the illumination at least partially separates the selected passive optical nanostructures 938 from the rest of the monolithic array of passive optical nanostructures 938 and the growth substrate 900, along with portions of the release layer 901 attached to the selected passive optical nanostructures 938. This may be at least partially achieved by the illumination dissociating a layer of the material forming the release layer 901 to form a gas. The selected passive optical nanostructures 938 remain adhered to the transfer member 902 via the adhesive layer 904 which enables them to be removed by lifting them off along with the transfer member 902. In addition to the illumination, etching and/or scribing may also be used to help separate the selected passive optical nanostructures from the rest of the monolithic array.

Figure 7G:
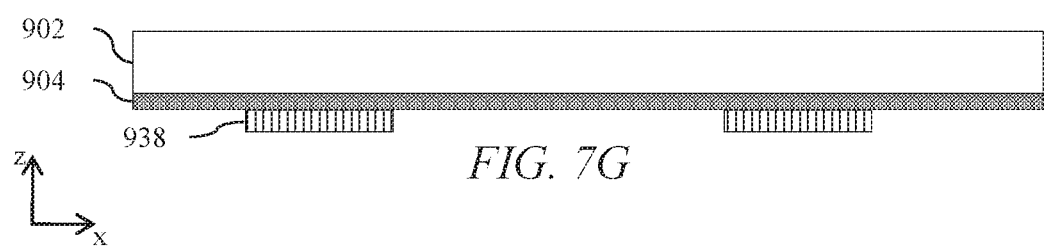

As illustrated by FIG. 7G, then release layer portions which are still attached to the removed passive optical nanostructures 938 are removed for example by etching or washing.

Figure 7H:
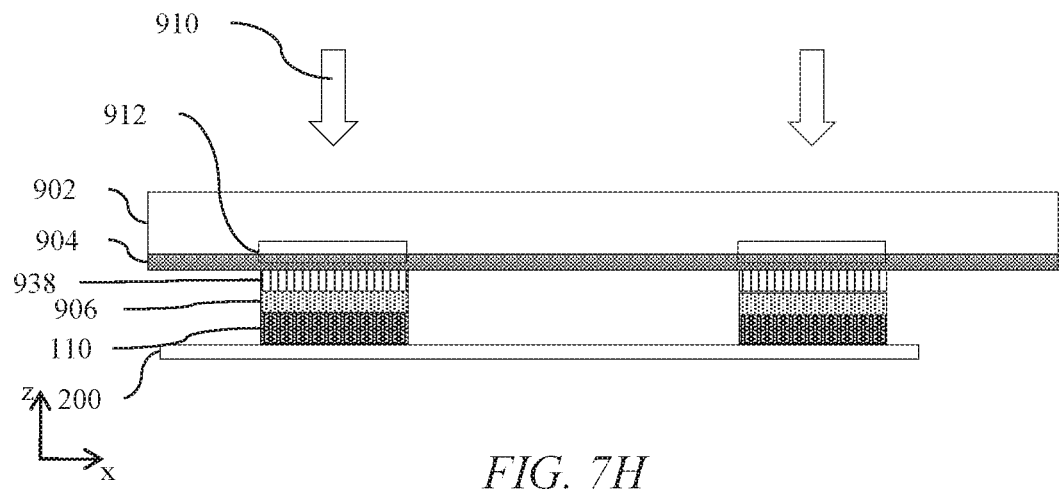
Figure 7I:
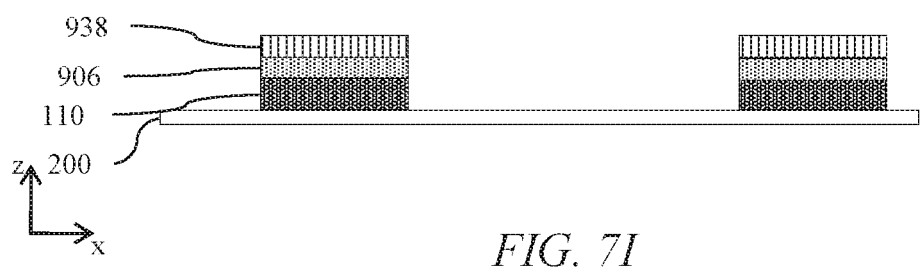

Then, as illustrated by FIGS. 7H and 7I, the removed passive optical nanostructures 938 are transferred from the transfer member 902 onto respective LEDs 110 on a support substrate 200. The transfer may comprise illuminating the passive optical nanostructures 938 with light 910 to separate them from the carrier substrate and/or adhering the passive optical nanostructures 938 to the LEDs 110 with adhesive 906. Alternatively a thermal process or differential bonding adhesion may be used. The passive optical nanostructures 938 may then be cleaned to remove any excess material. In the present illustrative embodiments some of the passive optical nanostructures 938 are illustrated as the same size as LEDs 110; however, they may be larger or smaller.

Figure 8A:
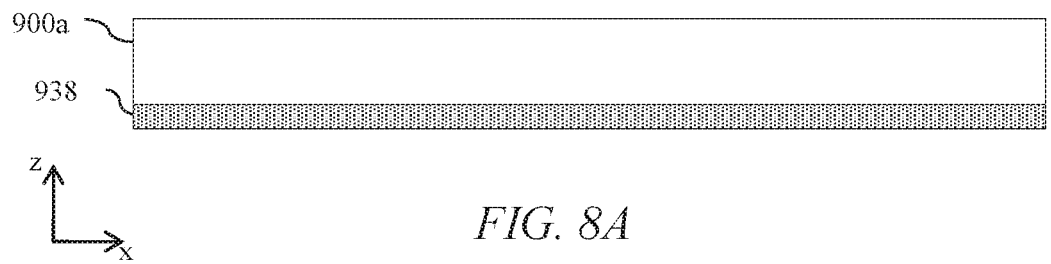
FIGS. 8A-B are schematic diagrams illustrating further steps of a method of manufacturing passive optical nanostructures.
Figure 8B:
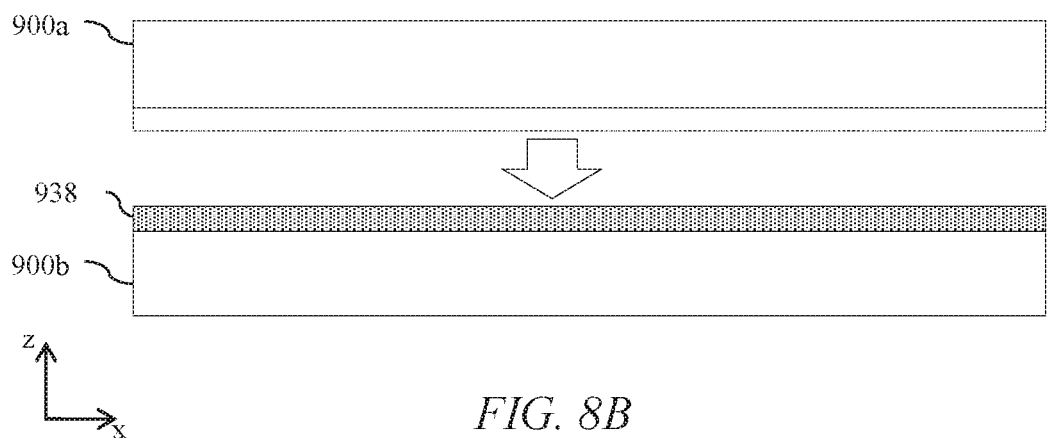

FIGS. 8A-B are schematic diagrams illustrating an alternative way of growing the passive optical nanostructures 938 to that shown in FIGS. 7A to 7C. Features of the embodiments of FIGS. 8A-B not discussed in further detail may be assumed to correspond to the features with equivalent reference numerals as discussed above, including any potential variations in the features.

As illustrated by FIG. 8A, instead of being grown on a substrate which is transparent to light in the electromagnetic wavelength band, the monolithic array of passive optical nanostructures 938 is grown on a substrate 900a which is opaque to light in the electromagnetic wavelength band. Then, as illustrated by FIG. 8B, the monolithic array of passive optical nanostructures 938 is transferred to a substrate 900b which is transparent to the light in the electromagnetic wavelength band. Then, the steps illustrated by FIGS. 7D to 7I may be performed. The transfer may use a release layer (not shown) and may use a layer on substrate 900a (not shown) which is etched.

Figure 9:
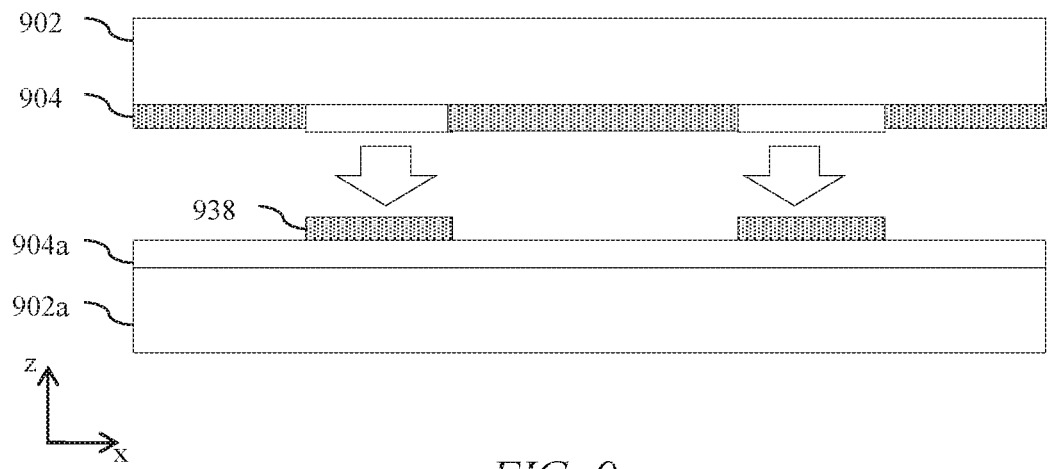
FIG. 9 is a schematic diagram illustrating a further step of a method of manufacturing passive optical nanostructures.

FIG. 9 is a schematic diagram illustrating an additional step which may be performed between steps 7G and 7H. Features of the embodiment of FIG. 9 not discussed in further detail may be assumed to correspond to the features with equivalent reference numerals as discussed above, including any potential variations in the features.

As illustrated by FIG. 9, the removed passive optical nanostructures 938 are transferred from the transfer member 902 onto another transfer member 902a in a manner that preserves the relative spatial position of the selectively removed light-emitting elements. This is achieved by adhering the passive optical nanostructures 938 to an adhesive layer 904a of the other transfer member 902a while the passive optical nanostructures are still adhered to the adhesive layer 904 of the transfer member 902 and pulling apart the two carrier substrates 902, 902a. The adhesive force of the adhesive layer 904a on the passive optical nanostructures is greater than the adhesive force of the adhesive layer 904 and so the passive optical nanostructures detach from the adhesive layer 904 and adhere to the adhesive layer 904a. In this way, the passive optical nanostructures are flipped so that a different, opposite surface of each of the passive optical nanostructures is exposed. The strength of the adhesive layer 904 may be modified by heat and/or UV light for example.

FIGS. 10A-E are schematic diagrams illustrating moth eye structures 300 as a type of passive optical nanostructure which may be manufactured according to the methods described above with reference to FIGS. 3 to 9. Features of the embodiments of FIGS. 10A-E not discussed in further detail may be assumed to correspond to the features with equivalent reference numerals as discussed above, including any potential variations in the features.

Figure 10A:
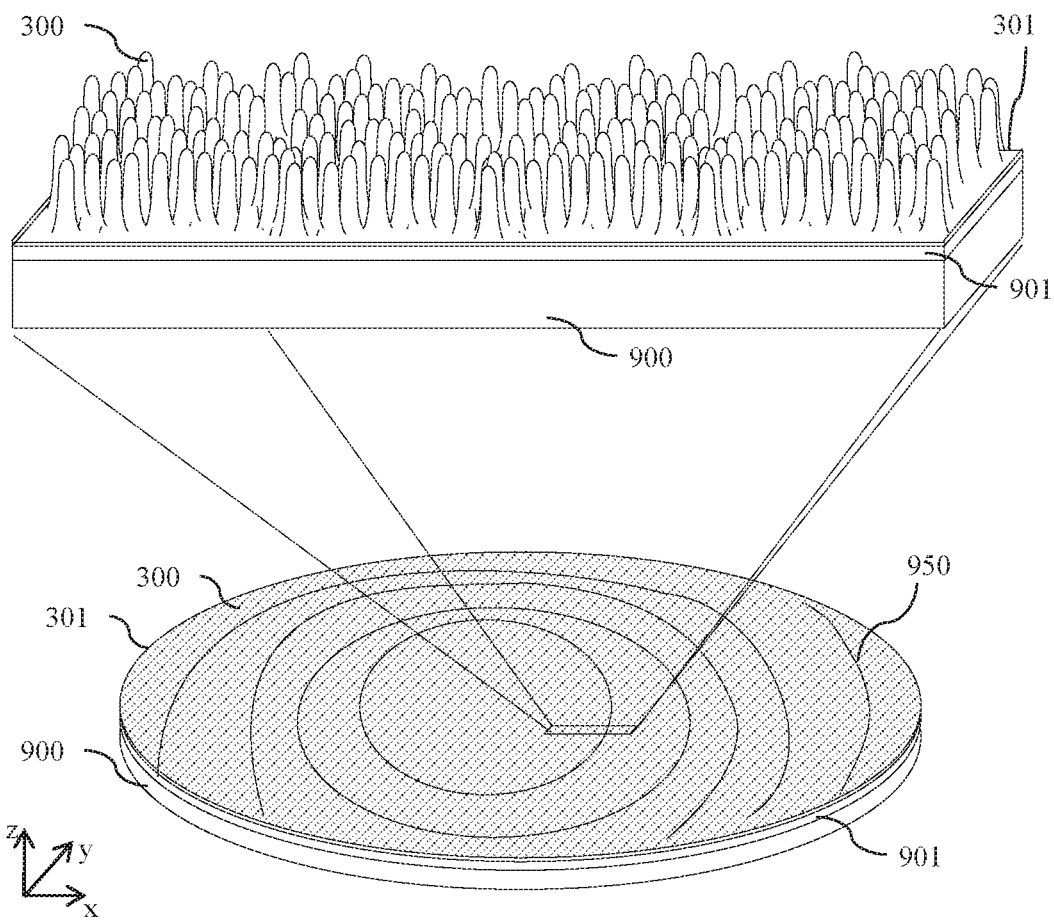
FIGS. 10A-E are schematic diagrams illustrating moth eye structures as an example of a type of passive optical nanostructure.
Figure 10B:
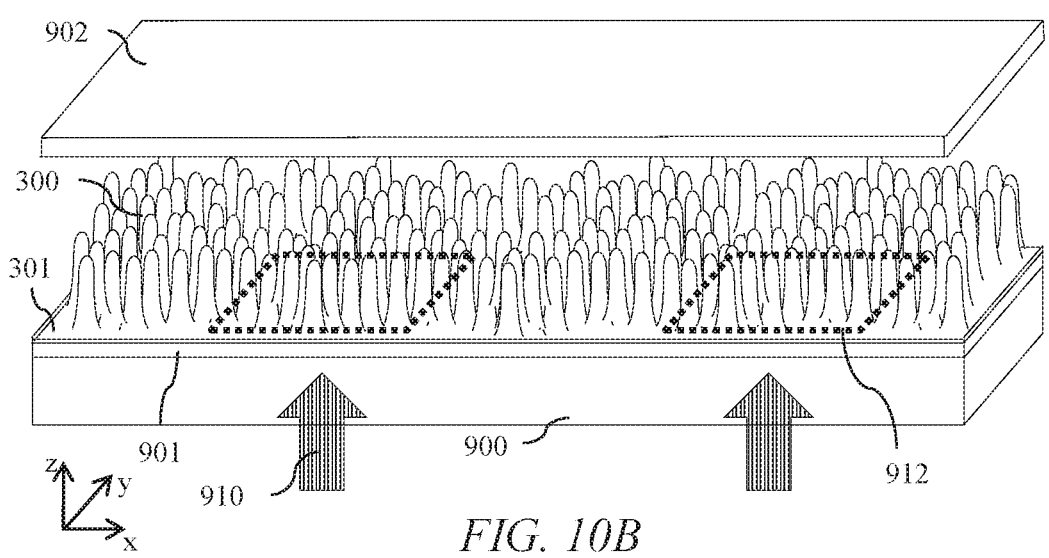
Figure 10C:
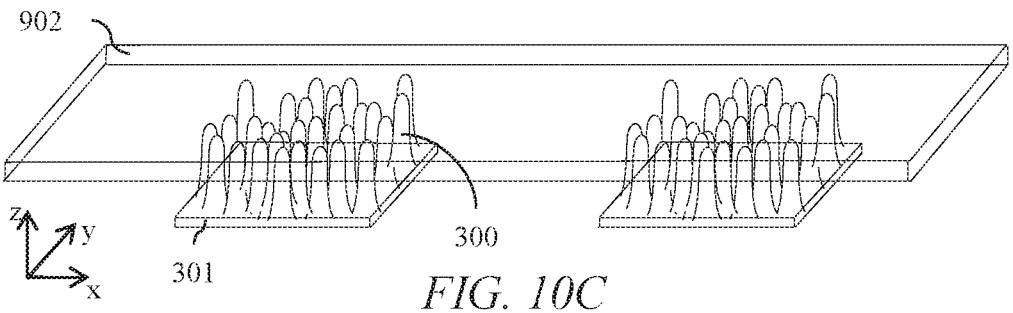
Figure 10D:
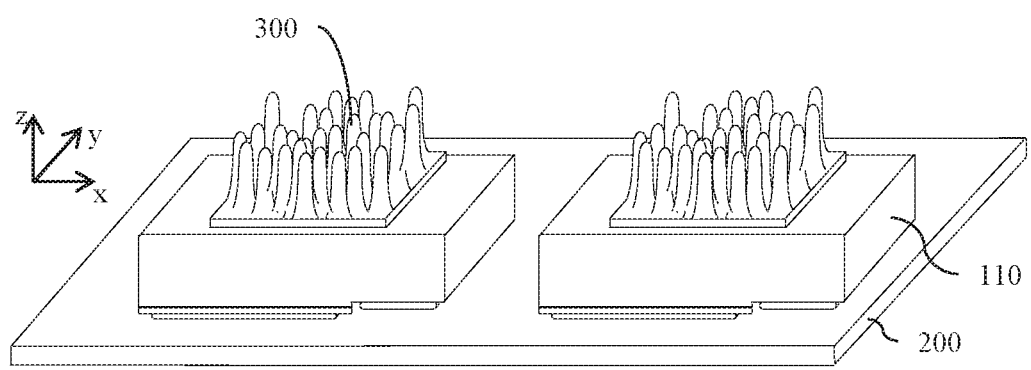
Figure 10E:
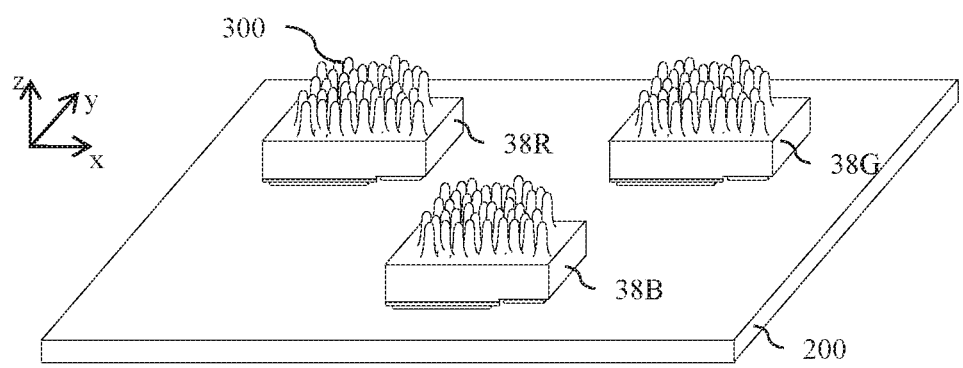

As illustrated by FIG. 10A, the moth eye structures 300 are grown attached to a base layer 301 on top of release layer 901. FIGS. 10B to 10D illustrate the removal and transfer of the moth eye structures 300 onto LEDs 110 on a support substrate 200 in accordance with the above-described methods. FIG. 10E is a schematic diagram illustrating a non-monolithic array of moth eye structures 300 formed on a non-monolithic array of LEDs 38R, 38G, 38B.

Advantageously the efficiency of light extraction from each LED may be increased.

FIGS. 11A-G are schematic diagrams illustrating quantum rod structures 400 as a type of passive optical nanostructure which may be manufactured according to the methods described above with reference to FIGS. 3 to 9. Features of the embodiments of FIGS. 11A-G not discussed in further detail may be assumed to correspond to the features with equivalent reference numerals as discussed above, including any potential variations in the features.

Figure 11A:
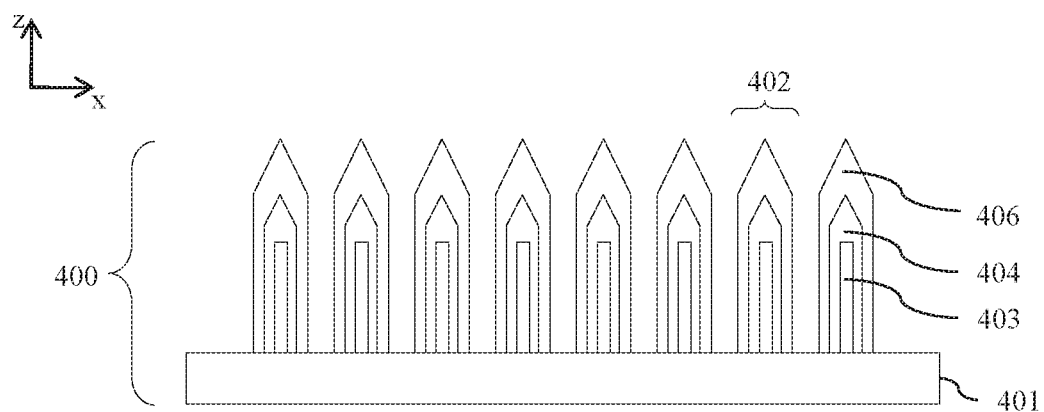
FIGS. 11A-G are schematic diagrams illustrating quantum rods as an example of a type of passive optical nanostructure.
Figure 11B:
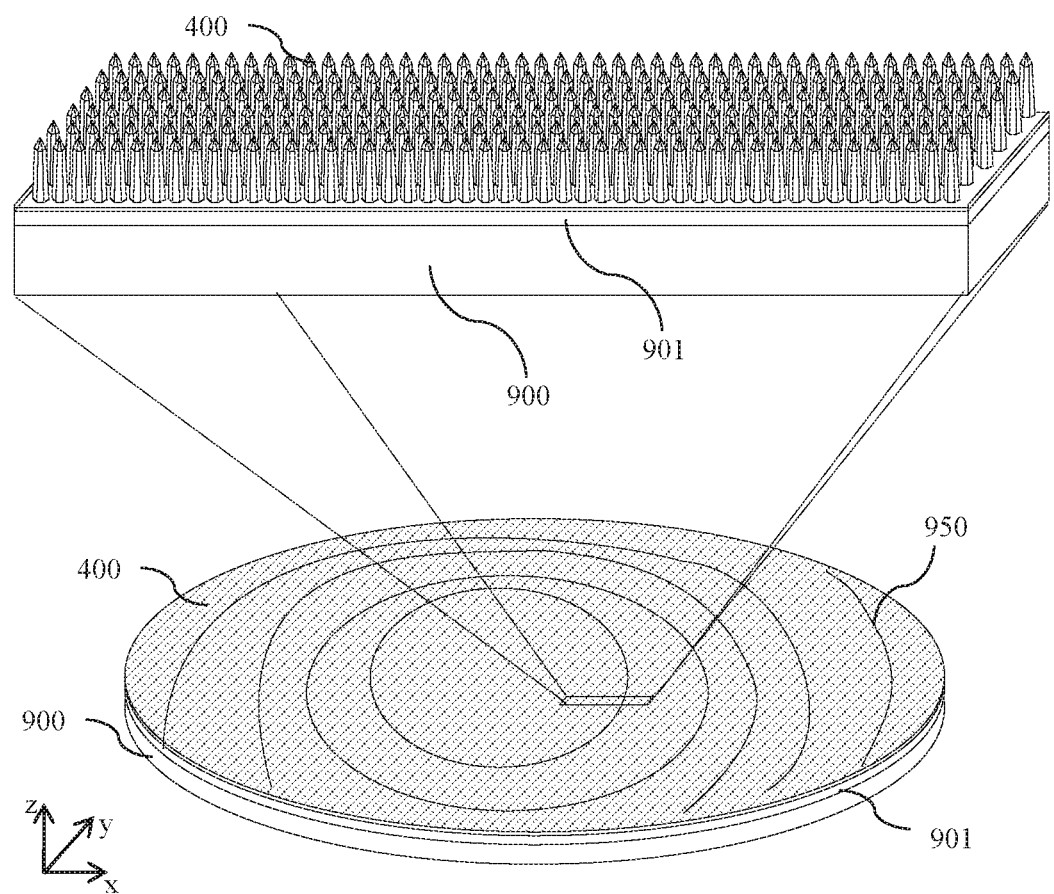
Figure 11C:
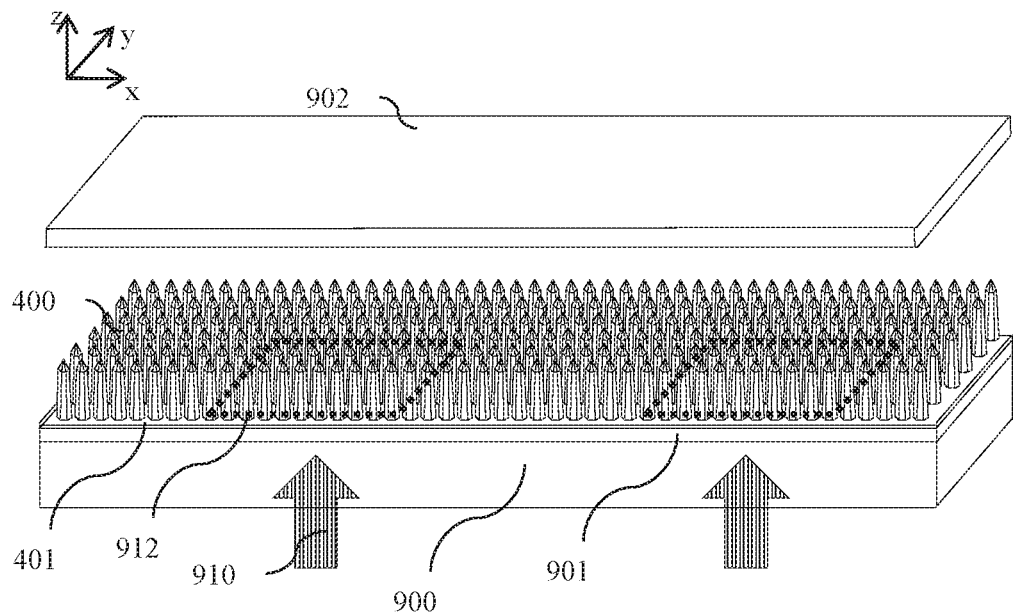
Figure 11D:
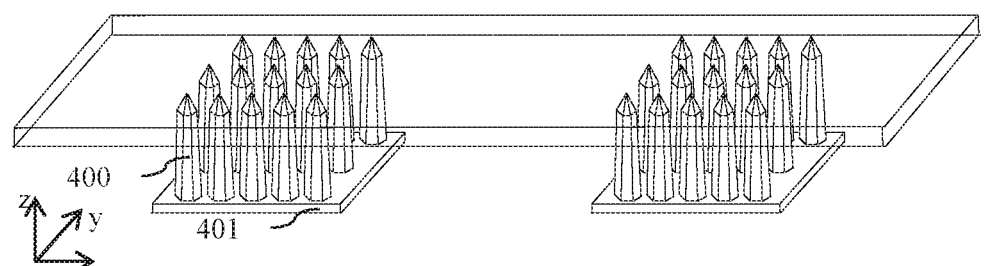
Figure 11E:
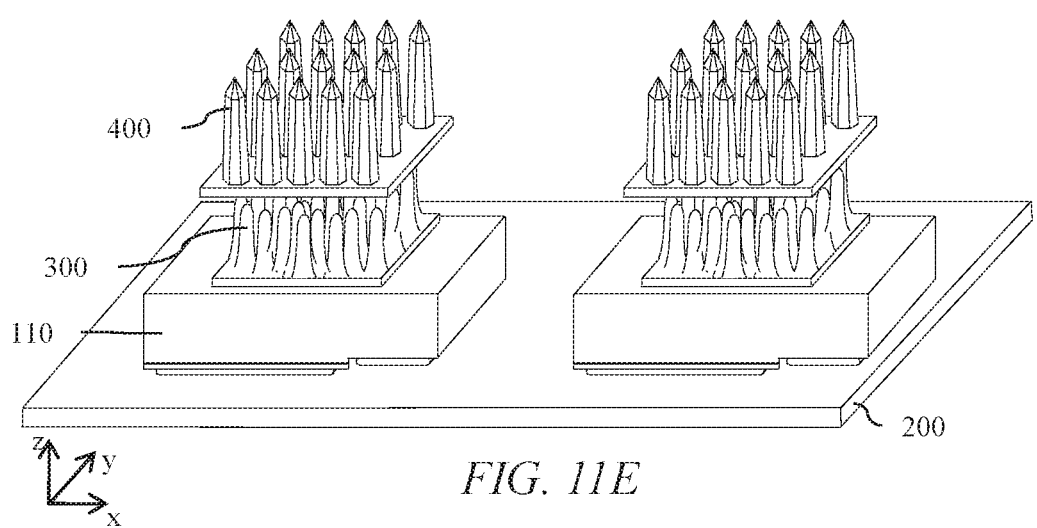

As illustrated by FIG. 11A, the quantum rod structures 400 comprise a plurality of quantum rods 402 on a growth substrate 401. In an illustrative example each quantum rod 402 comprises an n-doped internal rod structure 403, multiple quantum wells 404 and p-doped outer layers 406. The materials may include for example, GaN, InGaN, AlInGaP and other known wavelength conversion photoluminescent materials.

The quantum rods 402 are arranged on LEDs 110 and convert the wavelength of light from LEDs 110, for example converting blue light to red light or converting ultra-violet radiation to red green light.

In comparison to coating quantum dot materials onto the LEDs, the quantum rods that are grown on wafers may be placed with high precision and may be conveniently patterned to provide coverage of the emission regions of the LEDs. Advantageously efficiency may be increased. The nanorods may be selected from regions 952 of wafer of FIG. 4 to provide colour variations that match the colour output of the aligned LED. Advantageously accuracy of colour conversion may be increased.

Figure 11F:
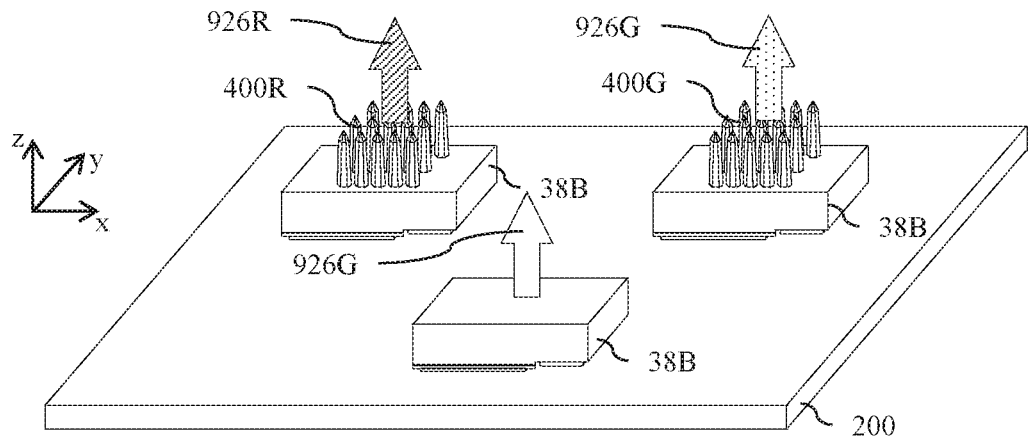
Figure 11G:
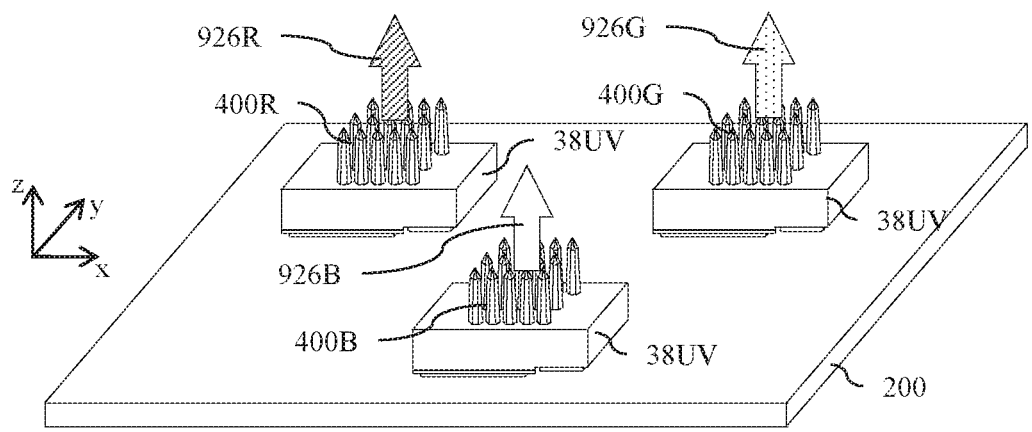

FIGS. 11B to 11E illustrate the removal and transfer of the quantum rod structures 400 onto LEDs 110 on a support substrate 200 in accordance with the above-described methods. FIG. 11F is a schematic diagram illustrating a non-monolithic array of quantum rod structures 400R, 400G formed on a non-monolithic array of LEDs 38B for the purpose of converting blue light to red or green light or UV light to blue, green or red light. As illustrated, not all of the LEDs 38B have a quantum rod structure 400R, 400G stacked thereon. FIG. 11G is a schematic diagram illustrating another non-monolithic array of quantum rod structures 400R, 400G, 400B formed on a non-monolithic array of LEDs 38UV for the purpose of converting UV light to red, green or blue light. As illustrated, in this array, all of the LEDs 38UV have a quantum rod structure 400R, 400G, 400B stacked thereon.

FIGS. 12A-E are schematic diagrams illustrating wire grid polarisers 500 as a type of passive optical nanostructure which may be manufactured according to the methods described above with reference to FIGS. 3 to 9. Features of the embodiments of FIGS. 12A-E not discussed in further detail may be assumed to correspond to the features with equivalent reference numerals as discussed above, including any potential variations in the features.

Figure 12A:
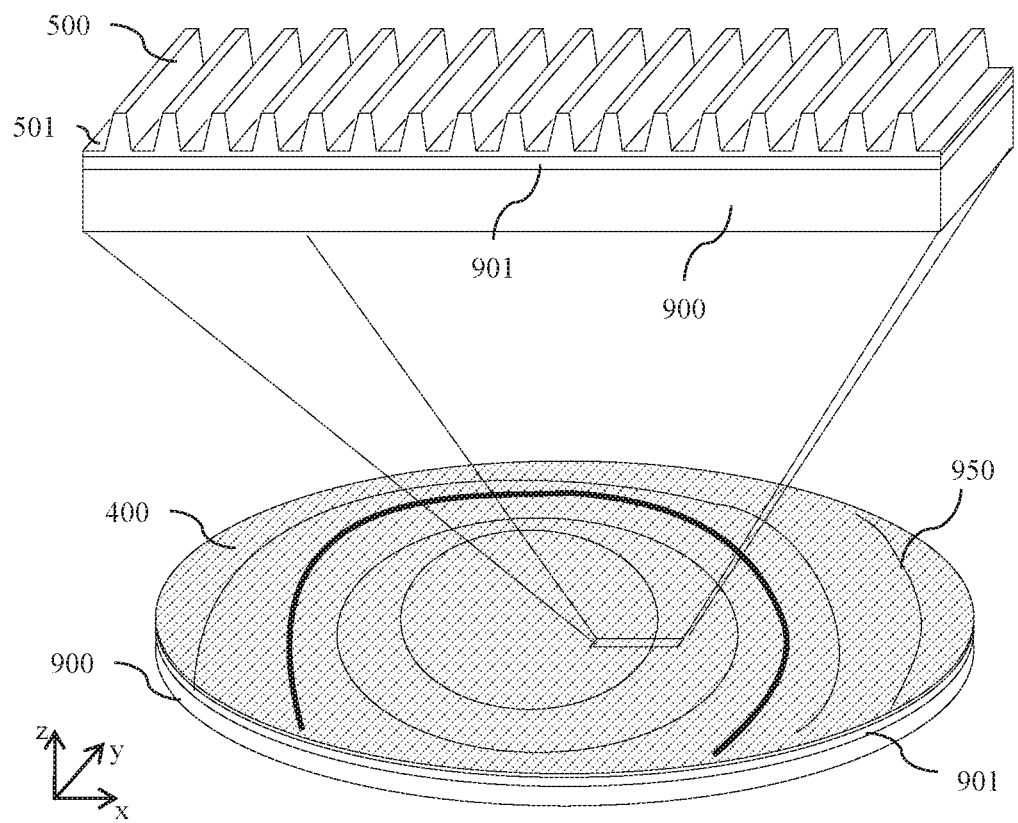
FIGS. 12A-E are schematic diagrams illustrating wire grid polarisers as an example of a type of passive optical nanostructure.
Figure 12B:
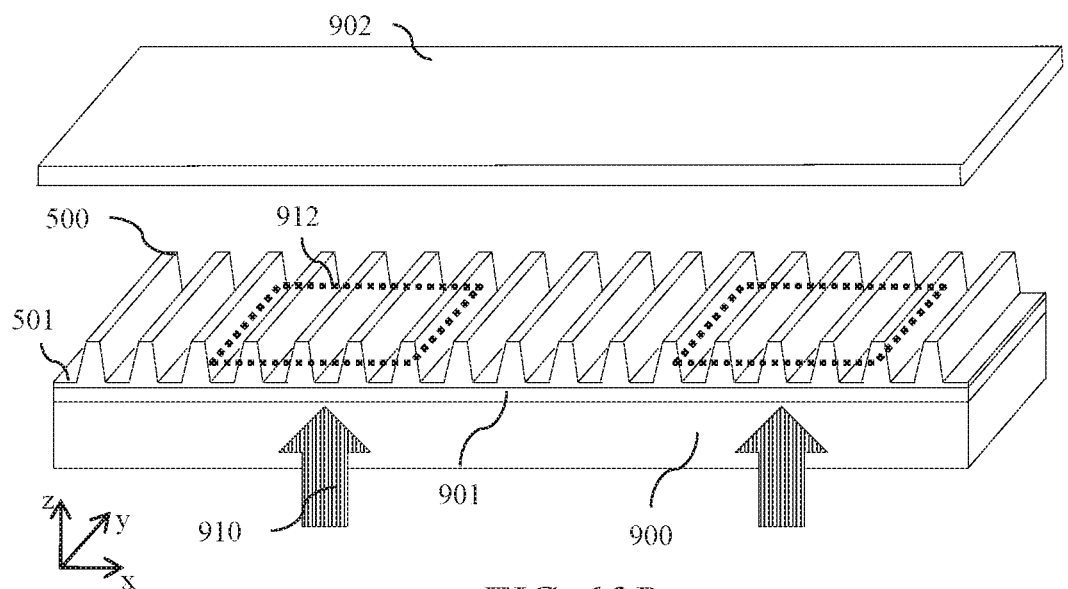
Figure 12C:
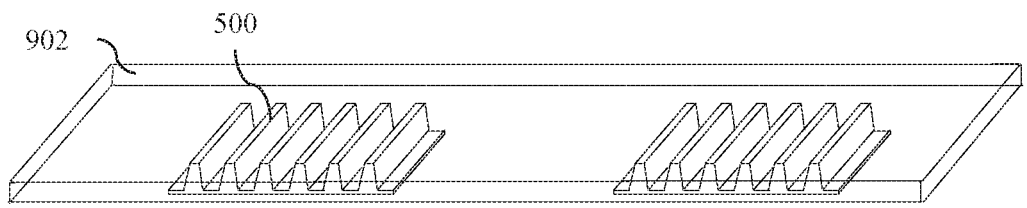
Figure 12D:
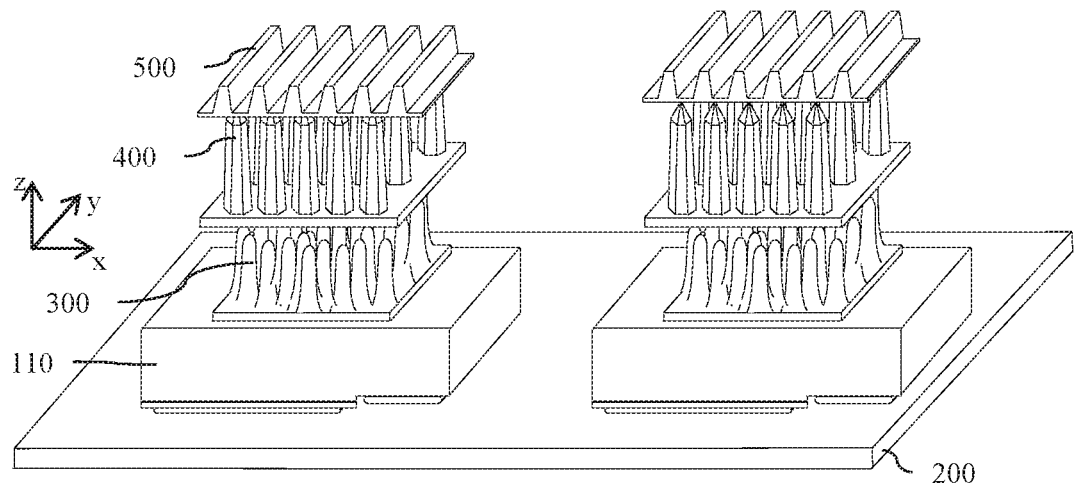
Figure 12E:
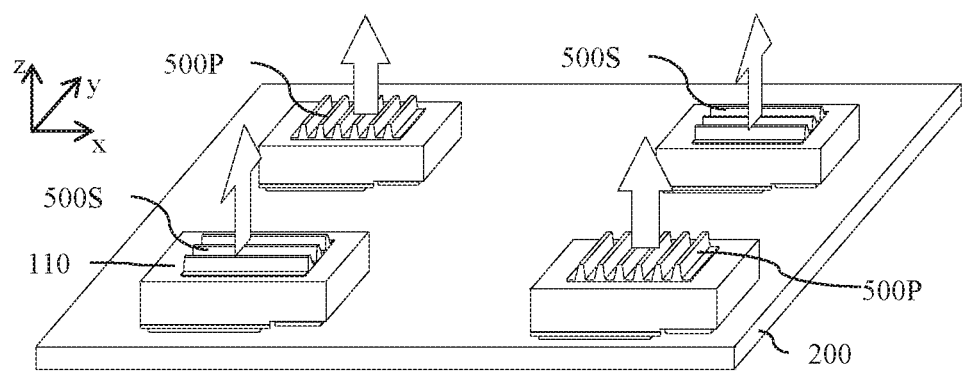

As illustrated by FIG. 12A, the wire grid polarisers 500 are grown attached to a base layer 501 on top of release layer 901. FIGS. 12B to 12D illustrate the removal and transfer of the wire grid polarisers 500 onto LEDs 110 on a support substrate 200 in accordance with the above-described methods. FIG. 12E is a schematic diagram illustrating a non-monolithic array of wire grid polarisers 500P, 500S formed on a non-monolithic array of LEDs 110. As illustrated, some of the wire grid polarisers 500P polarise light in a first direction and some of the wire grid polarisers 500S polarise light in a second, orthogonal direction to the first direction. This is achieved by placing the wire grid polarisers 500S, 500P on the LEDs 110 in different, orthogonal orientations depending on which polarisation direction is required. The wire grid polarisers 500 can be placed in other orientations for example +/−45 degrees.

Figure 13A:
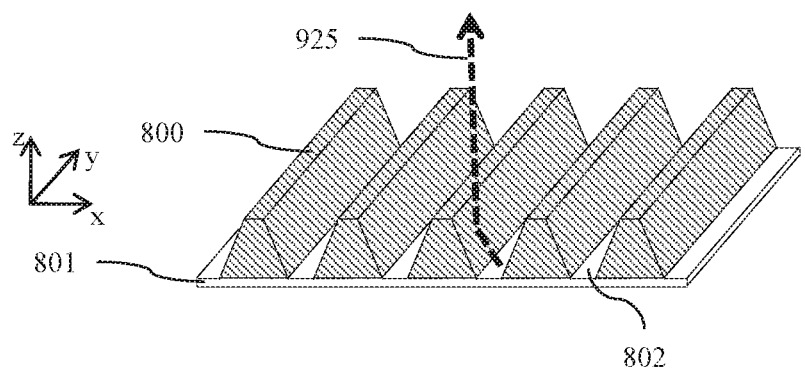
FIGS. 13A-B are schematic diagrams illustrating collimating nanostructures as an example of a type of passive optical nanostructure.
Figure 13B:
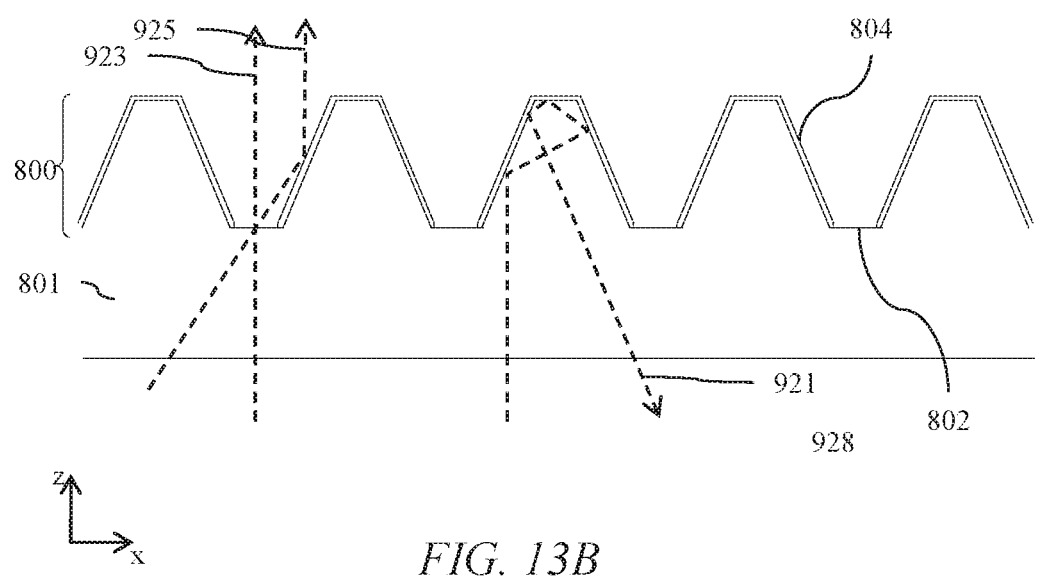

FIGS. 13A-B are schematic diagrams illustrating collimating nanostructures 800 as a type of passive optical nanostructure which may be manufactured according to the methods described above with reference to FIGS. 3 to 9. Features of the embodiments of FIGS. 13A-B not discussed in further detail may be assumed to correspond to the features with equivalent reference numerals as discussed above, including any potential variations in the features.

As illustrated by FIG. 13A, the collimating nanostructures 800 are formed attached to a base layer 801 with gaps 802 between adjacent collimating nanostructures 800. As illustrated by FIG. 13B, light emitted from the LEDs is received by the collimating nanostructures 800. Some light 923 is not deflected by the collimating nanostructures 800 and passes through the gaps 802, some light 925 is deflected by a sloped side 804 of the collimating nanostructures 800 such that it is collimated and continues travelling away from the LEDs, and some light 921 is reflected back towards the LEDs by the collimating nanostructures 800.

FIGS. 14A-F are schematic diagrams illustrating air gap enclosing nanocolumns 700 as a type of passive optical nanostructure which may be manufactured according to the methods described above with reference to FIGS. 3 to 9. Features of the embodiments of FIGS. 14A-F not discussed in further detail may be assumed to correspond to the features with equivalent reference numerals as discussed above, including any potential variations in the features.

Figure 14A:
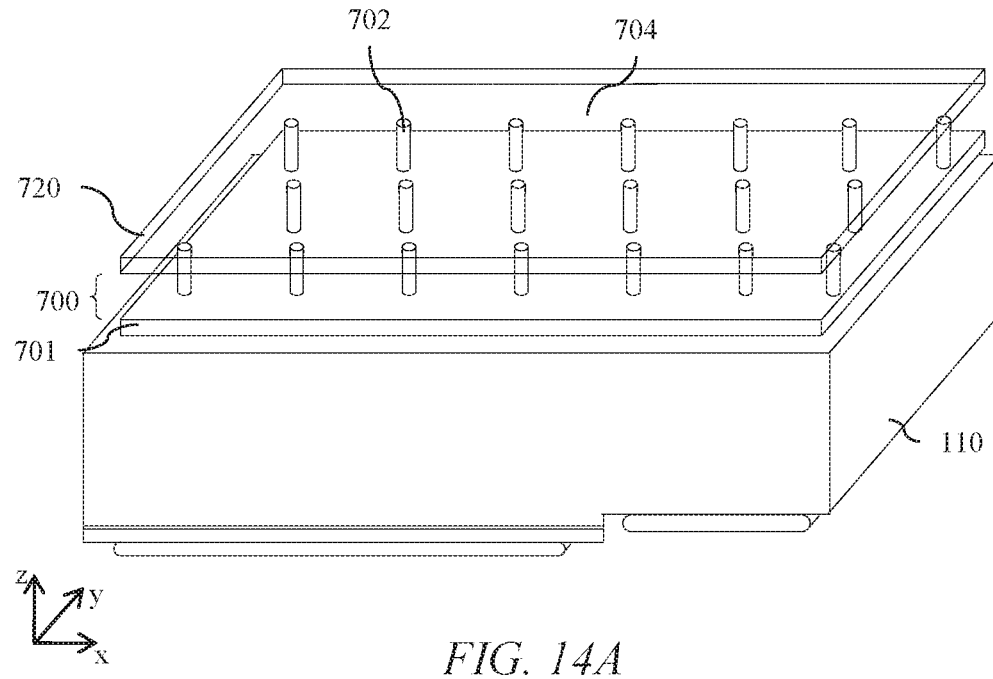
FIGS. 14A-B are schematic diagrams illustrating air gap enclosing nanocolumns as an example of a type of passive optical nanostructure.
Figure 14B:
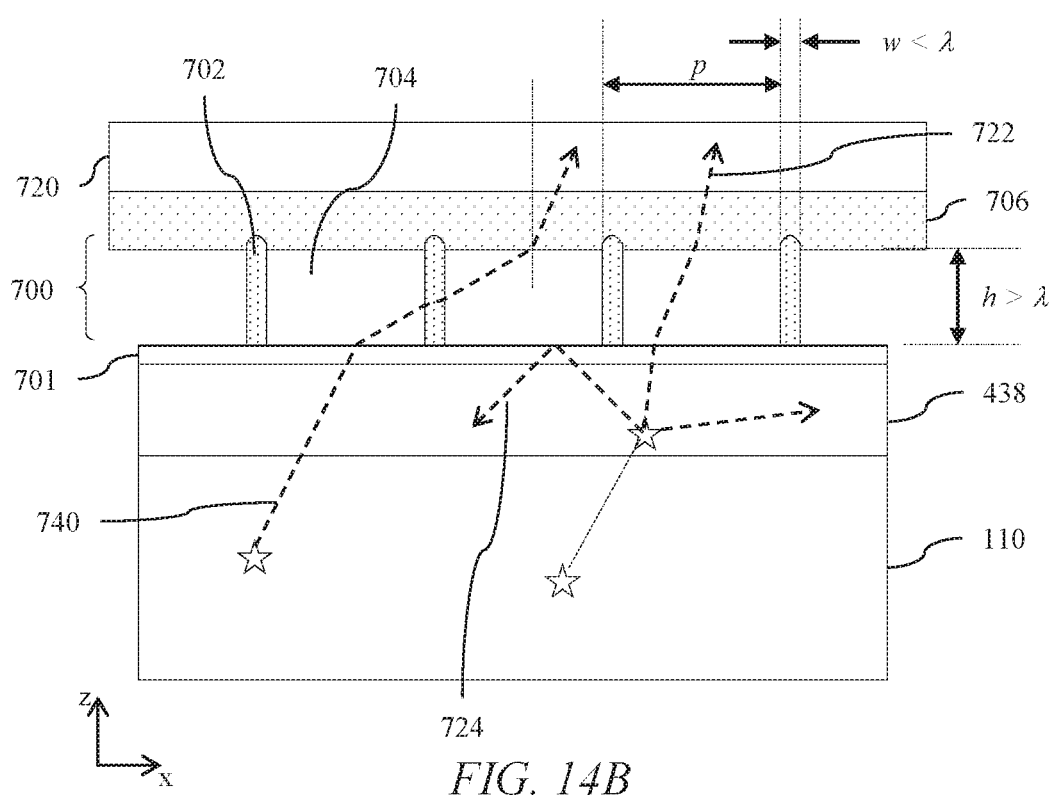

As illustrated by FIG. 14A, the air gap enclosing nanocolumn 700 is sandwiched between an LED 110 and a substrate 720. The air gap enclosing nanocolumn 700 comprises a plurality of pillars 702 extending from a base layer 701. The pillars 702 act to separate the substrate 720 from the LED 110 and define an air gap 704 between the LED 110 and the substrate 720. As illustrated by FIG. 14B, the pillars 702 are coupled to a substrate 720 by an adhesive layer 706.

A colour conversion layer 438 is located between the base layer 701 and the LED 110. In operation, light from the LED 110 reaching the interface between the base layer 701 and the air gap 704 is totally internally reflected if it hits the interface at an angle of incidence greater than the critical angle. Thus, only light which hits the interface at an angle of incidence less than the critical angle passes through the interface. Light ray 740 is a ray which has not been colour converted by colour conversion layer 438 and passes through the air gap 704 as its angle of incidence at the interface is less than the critical angle. Light ray 722 is a ray which has been colour converted by colour conversion layer 438 and passes through the air gap 704 as its angle of incidence at the interface is less than the critical angle. Light ray 724 is a ray which has been colour converted by colour conversion layer 438 and which is totally internally reflected at the interface. This advantageously tends to mean that light reaching the substrate 720 through the air gap has a restricted range of angles and is therefore less scattered and more focused and less likely to be captured into a mode propagating by guiding in one of the substrate layers for example 720.

Desirable dimensional properties of the passive optical nanostructure 130 for a nominal wavelength of 550 nm will now be described. The spacers 132 each have a height h greater than the wavelength λ of the light travelling through the air gap 133. The width w and pitch p of the spacers 132 is arranged to minimise diffractive light scatter from the spacers 132 of the light travelling through the air gap 133, and to minimise guiding of light within the spacers 132.

The pitch p may be less than 2λ, preferably less than λ, more preferably less than λ/2 and most preferably less than λ/5. The ratio w/p may be less than 0.5, and preferably less than 0.3 and more preferably less than 0.1. Such elements may provide high angle diffraction or zero order diffraction. Advantageously diffractive scatter from the spacers and gaps between the spacers may be reduced, minimising light scatter between adjacent curved reflectors 222A, 222B. Such elements may be provided by lithographic fabrication techniques on a monolithic wafer. The elements may be transferred from the monolithic wafer or may be arranged to provide a replication tool as described elsewhere herein.

By way of comparison with passive optical nanostructures a low effective index and small angle diffractive scatter may be achieved for example with passive optical microstructures with pitch p of 20 microns and width w of 5 microns. Such spacers guide incident light within the spacers, and provide Lambertian input to the optical structure 220. Undesirable cross talk between the reflectors 220A, 220B may be provided.

The air gap enclosing nanocolumns 700 have an effective refractive index $n_1$ given by the equation:

$$n_1 = 1 + \frac{w^2}{p^2}(n - 1) \qquad \text{eqn. 1}$$

where n1 is the effective refractive index, n is the refractive index of the pillars 702, p is the distance between adjacent pillars 702 and w is the width of the columns.

Light can be input into an optical element with controlled cone angle and high efficiency, while achieving bonding to the LED by external substrates. Optical cross talk in illumination systems can be reduced and mechanical and thermal stability improved.

It may be desirable to provide very low light reflectivity for regions around the LED.

Figure 15A:
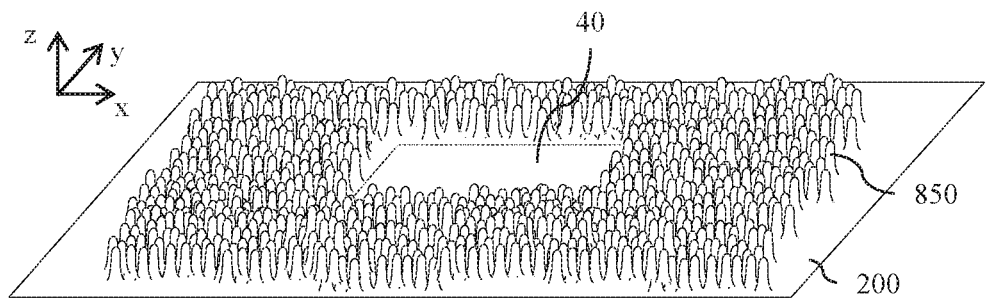
FIGS. 15A-C are schematic diagrams illustrating the use of nano-black structures to surround LEDs.
Figure 15B:
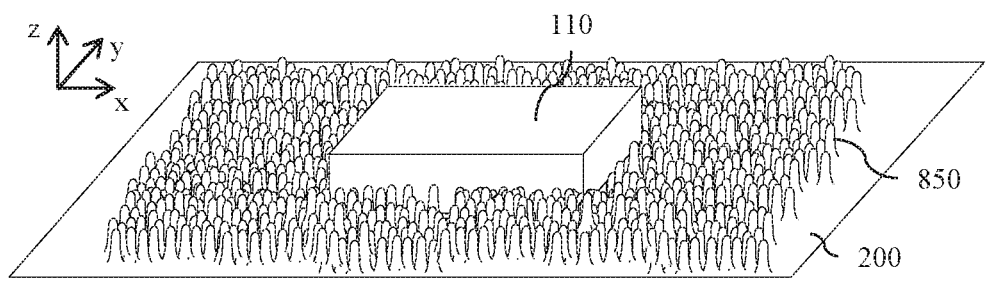
Figure 15C:
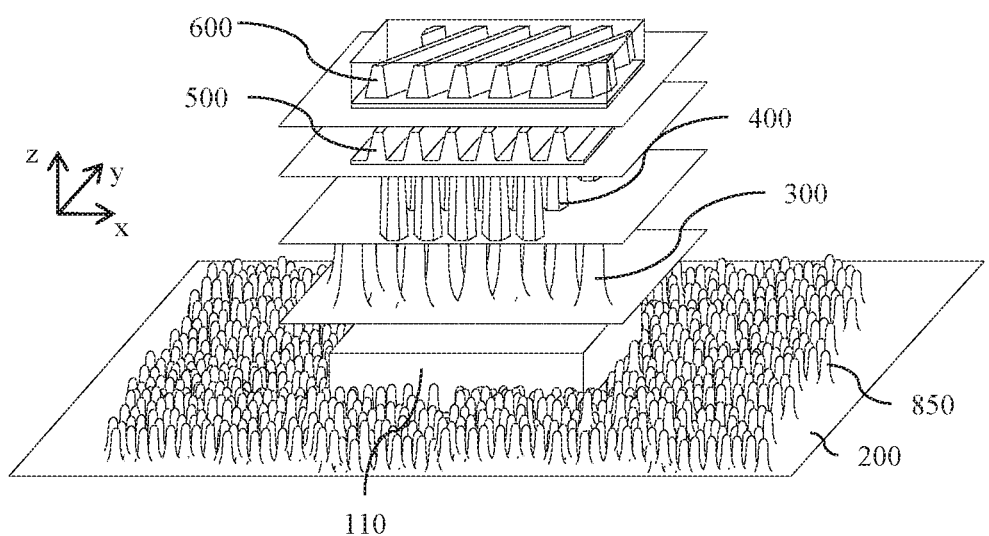
Figure 16A:
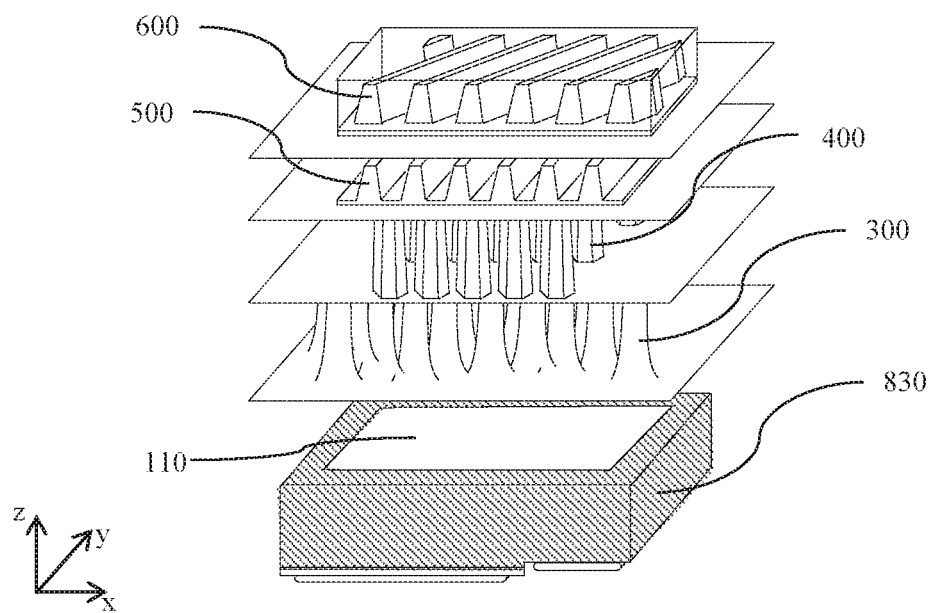
FIGS. 16A-E are schematic diagrams illustrating the use of a well to surround LEDs.
Figure 16B:
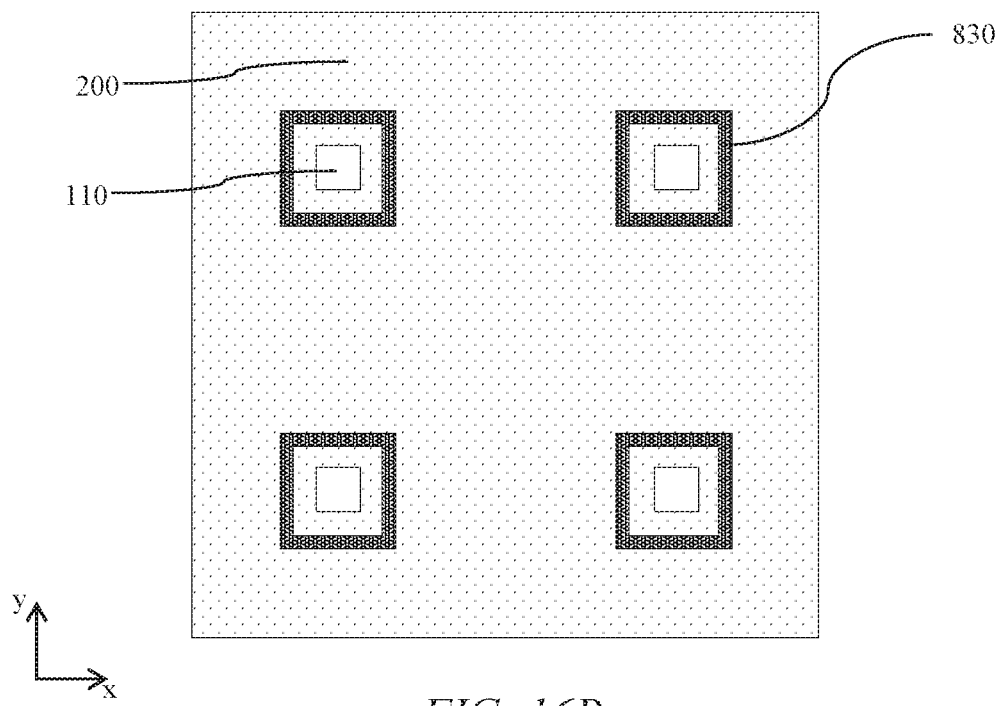
Figure 16C:
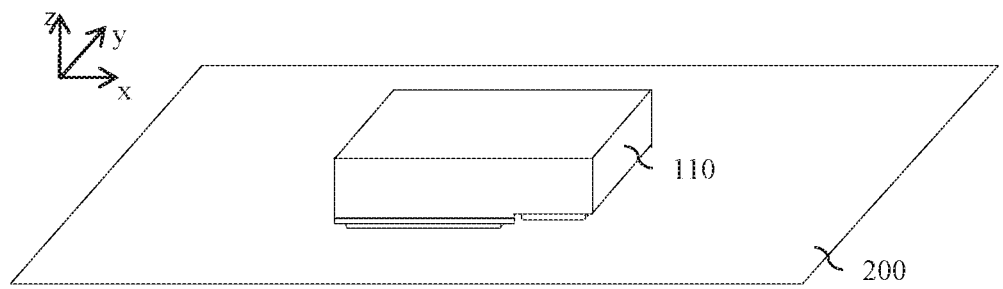
Figure 16D:
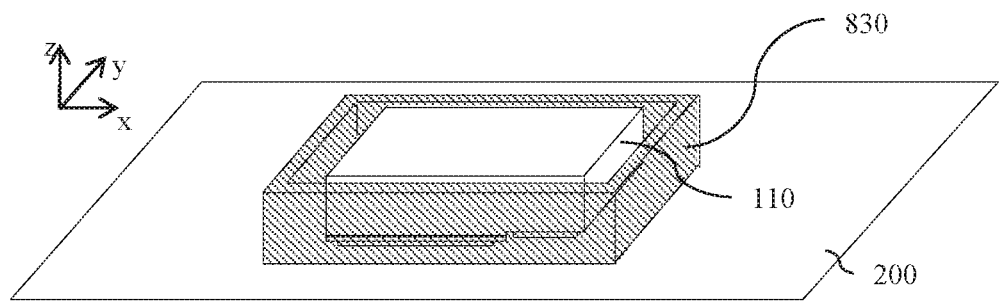
Figure 16E:
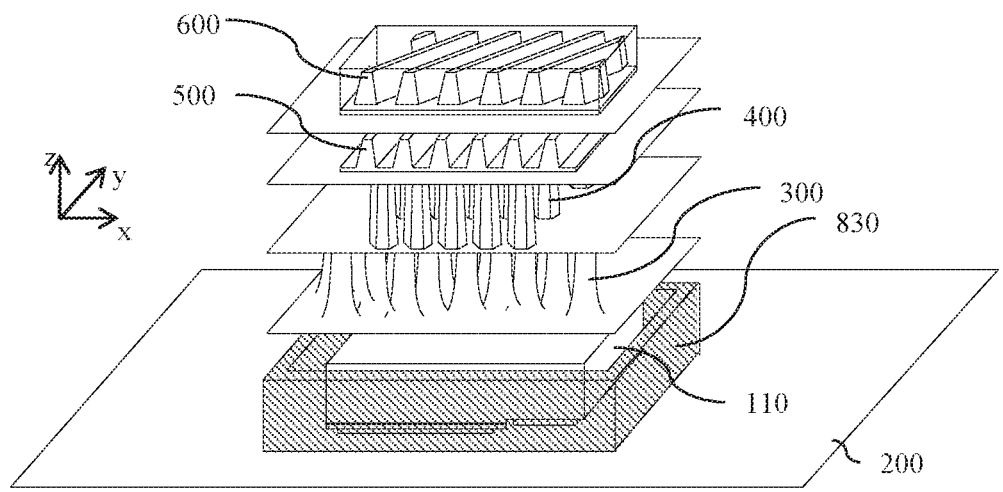

FIGS. 15A-C are schematic diagrams illustrating further steps which may be performed in addition to the manufacture and stacking of the passive optical nanostructures described above. Features of the embodiments of FIGS. 15A-C not discussed in further detail may be assumed to correspond to the features with equivalent reference numerals as discussed above, including any potential variations in the features.

As illustrated by FIG. 15A, prior to an LED 110 being placed on the support substrate 200, a nano-black structure is formed on the support substrate 200 around a space in which the LED 110 is to be placed. The nano-black structure 850 surrounds the space 40 but is not located in the space 40.

Nano-black structures absorb a very high proportion of incident light due to multiple reflections within a columnar absorbing surface. Advantageously stray light can be substantially reduced. In common with other passive optical nanostructures described elsewhere herein, high absorption nano-black materials may be manufactured using semiconductor process equipment on wafers and thus are expensive over large areas. It would be desirable to minimise the total area of nano-black material usage.

As illustrated by FIG. 15B, then the LED 110 is placed in the space 40 such that it is surrounded by the nano-black structure 850.

As illustrated by FIG. 15C, then various passive optical nanostructures 300, 400, 500, 600 are sequentially stacked on top of the LED 110 using any of the methods described above. The nano-black structure 850 acts to block light emitted from the LED 110 at wide angles to help provide a more directed light output. The nano-black structures also suppress the reflection of ambient light incident light on the display so that display contrast is improved. Further cross talk between adjacent LEDs may be substantially reduced, increasing image fidelity in a display application.

FIGS. 16A-E are schematic diagrams illustrating further steps which may be performed in addition to the manufacture and stacking of the passive optical nanostructures described above. Features of the embodiments of FIGS. 16A-E not discussed in further detail may be assumed to correspond to the features with equivalent reference numerals as discussed above, including any potential variations in the features.

As illustrated, a well 830 using a material such as a photoresist may formed around an LED 110 on the support substrate 200 after the LED 110 is placed on the support substrate 200. Then, various passive optical nanostructures 300, 400, 500, 600 are sequentially stacked on top of the LED 110 using any of the methods described above. The well 830 acts to block light emitted from the LED 110 at wide angles to help provide a more directed and controlled light output. The well may further have sloped and metallised sides to direct light more efficiently in a forward direction.

The wells may be formed on a monolithic wafer and transferred in the manner described elsewhere herein.

Methods to manufacture optical apparatuses comprising the light-emitting elements 110 and passive optical elements comprising air gap enclosing nanocolumns of the present embodiments will now be described.

Figure 17A:
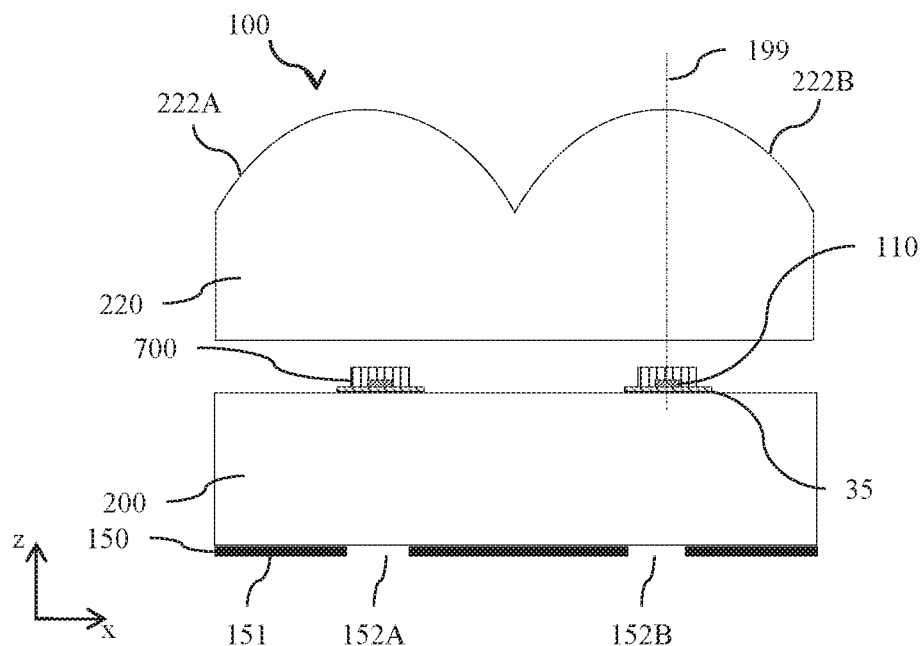
FIGS. 17A-B are schematic diagrams illustrating cross-sectional views of a method of attaching an optical structure to the support substrate during manufacture of the illumination apparatus.
Figure 17B:
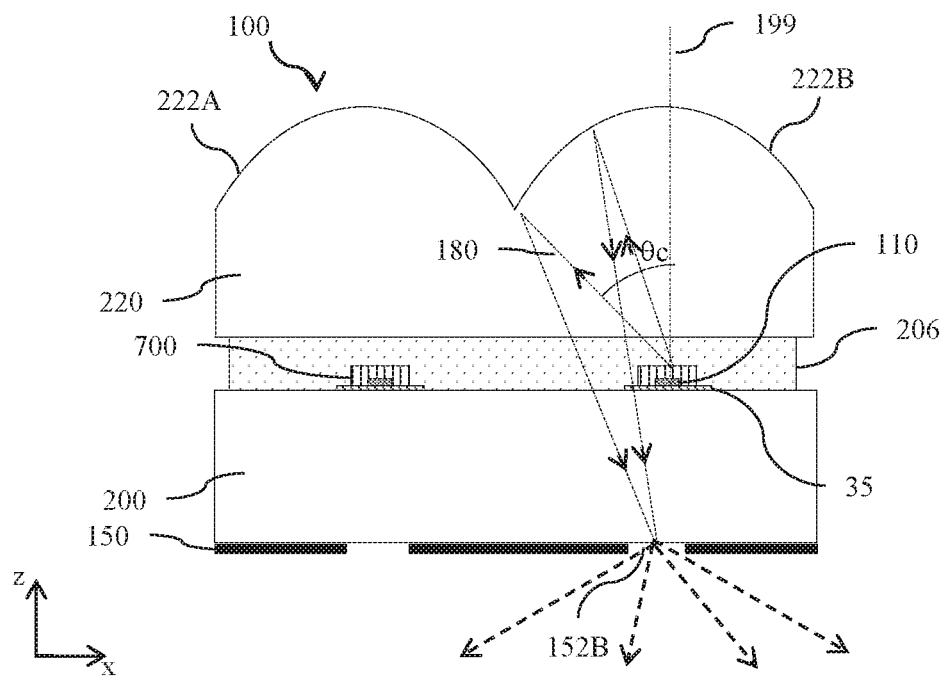

FIGS. 17A-B are schematic diagrams illustrating cross-sectional views of a method of attaching an optical structure 220 to the support substrate 200 during manufacture of the illumination apparatus 100. Features of the embodiments of FIGS. 17A-B not discussed in further detail may be assumed to correspond to the features with equivalent reference numerals as discussed above, including any potential variations in the features.

As shown in FIG. 17A, first the optical structure 220 is positioned above the support substrate 200, the support substrate 200 having the passive optical nanostructures that comprise air gap enclosing nanocolumns 700, light emitting elements 110, reflective mask 35, and an output mask 150 comprising opaque regions 151 and aperture regions 152 mounted thereto.

The output mask 150 opaque light absorbing region 151 may be formed from any appropriate opaque material, for example by printing a black material onto the substrate 200. The opaque region 151 may alternatively or additionally comprise a nanostructured black absorber, a "nanoblack" or other similar material such as that marketed by Acktar, (Kiryat-Gat, Israel). Advantageously very low reflectivity may be achieved from the front of the illumination apparatus.

The optical structure 220 comprises a plurality of concave curved reflective surfaces 222A, 222B, and is positioned such that each of its curved reflective surfaces 222A, 222B is aligned with a respective light emitting element 110, with optical axis 199.

The optical structure 220 may formed from a transparent main body and a reflective material disposed thereon constituting the curved reflectors 222A, 222B. The body of the optical structure 220 may be a glass or polymer material. The surface relief structure of the curved reflectors may be provided by a moulding or casting process material in a polymer material for example. A reflective layer may be formed on the curved reflectors 222A, 222B, for example a deposited metal coating that may comprise silver or aluminium materials as well as surface adhesion promoters and protective layers.

Then, as shown in FIG. 17B, an adhesive layer 206 is formed between the optical structure 220 and the support substrate 200 to attach the optical structure 220 to the support substrate 200. The adhesive layer 206 fills the space around the light emitting elements 110 and the passive optical nanostructures 700. The adhesive material of the adhesive layer 206 may be injected into the space between the optical structure 220 and the support substrate 200 in liquid form, and then subsequently set into solid form to bond the optical structure 220 to the support substrate 200, for example by UV and/or thermal cure. Advantageously thermal and mechanical variations are minimised during operation.

In operation, light rays 180 are output by the light-emitting element 110 and directed into the passive optical nanostructure 700 that comprises an air gap enclosing nanocolumns. Light output from the nanostructure 700 is provided within the critical angle θc of the material of the optical structure 220. Light from the light emitting element 110 is directed only to the aligned curved reflective surface 222B and is not directed to the curved reflective surface 222A.

After reflection at the curved reflective surface 222B, light rays 180 are directed towards the aperture 152 of the output mask 150 and is not substantially directed towards the opaque regions 150. Light is transmitted through the aperture region 152 to the observer. Reflective mask 35 is arranged to block light rays from the light-emitting element passing to the aperture 152 without reflection from the curved reflective surface 222B. Advantageously Fresnel reflections at the gap between the optical substrate 220 and support substrate 200 are reduced, increasing optical efficiency and reducing cross talk between adjacent channels.

Light rays 180 are directed to respective aligned aperture 152B and not to aperture 152A, advantageously reducing cross talk between adjacent channels. The light emitting elements 110 may be provided with image data and the illumination apparatus may be a display apparatus. Reflections from the opaque regions 151 of the output mask 150 may be reduced and advantageously image contrast in brightly lit environments may be increased.

It may be desirable to provide the passive optical elements 700 on the optical structure 220.

Figure 18A:
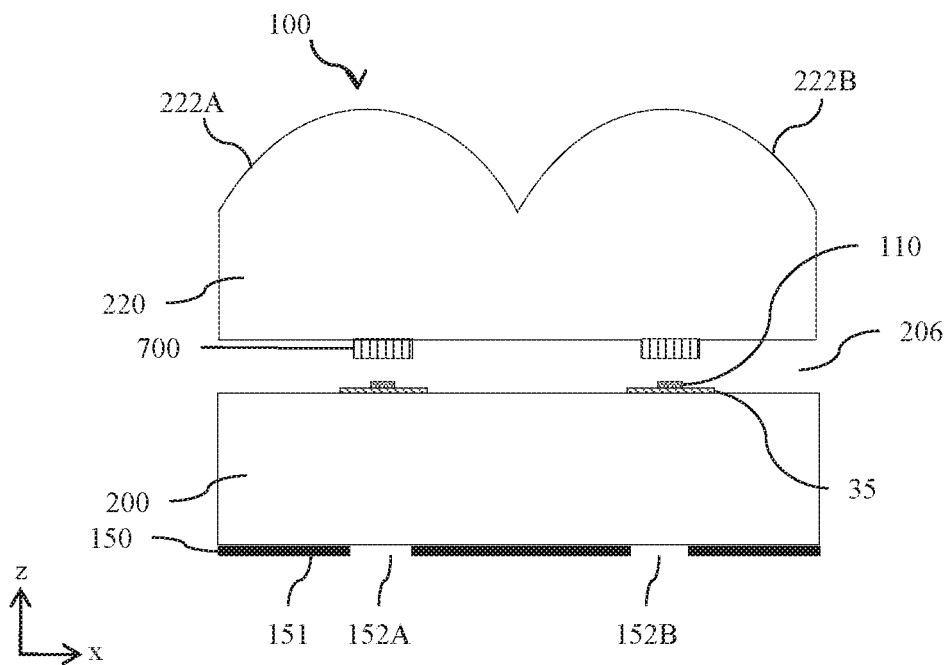
FIGS. 18A-B illustrate cross-sectional views of another method of attaching the optical structure to the support substrate during manufacture of the illumination apparatus.
Figure 18B:
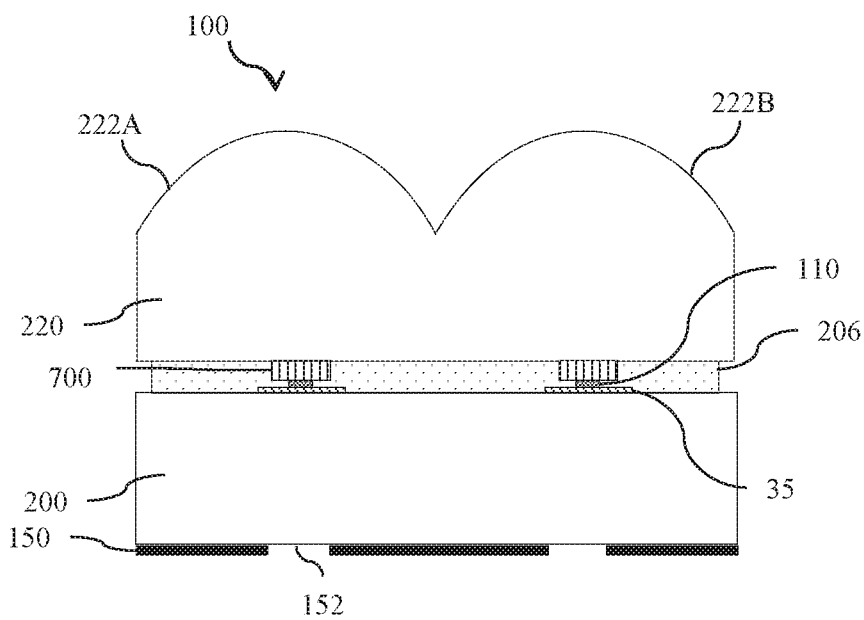

FIGS. 18A-B illustrate cross-sectional views of another method of attaching the optical structure 150 to the support substrate 200 during manufacture of the illumination apparatus 100. Features of the embodiments of FIGS. 18A-B not discussed in further detail may be assumed to correspond to the features with equivalent reference numerals as discussed above, including any potential variations in the features.

As shown in FIG. 18A, in this method, the optical structure 220 is positioned above the support substrate 200, with the support substrate 200 having the light emitting elements 110, reflective mask 35 and output mask 150 mounted thereto, and the optical structure 150 having the passive optical nanostructures 700 mounted thereto.

Each passive optical nanostructure 700 is mounted to the optical structure 220 such that it is aligned with a respective curved reflective surface 222A, 222B of the optical structure 220. The optical structure 220 is positioned such that each of its curved reflective surfaces 222A, 222B is aligned with a respective light emitting element 110.

Then, as shown in FIG. 18B, the adhesive layer 206 is formed between the optical structure 220 and the support substrate 200 to attach the optical structure 220 to the support substrate 200. The adhesive layer 206 fills the space around the light emitting elements 110 and the passive optical nanostructures 130. The adhesive of the adhesive layer 206 may be injected into the space between the optical structure 150 and the support substrate 200 in liquid form, and then subsequently set into solid form to bond the optical structure 150 to the support substrate 200. Operation of the structure is similar to that illustrated in FIG. 17B.

In comparison to the arrangement of FIG. 17B the passive optical nanostructure 700 is not formed on the light-emitting elements, to advantageously reduce the complexity and increase the yield of the substrate 200. The passive optical nanostructures 700 are provided with high uniformity and low cost as illustrated elsewhere herein. Advantageously device uniformity may be increased.

It may be desirable to provide the provide the optical elements on the optical structure 220.

Figure 19A:
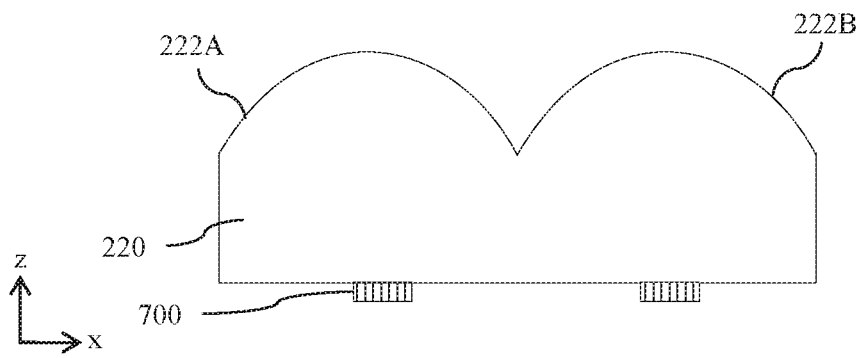
FIGS. 19A-C illustrate cross-sectional views of a method of manufacturing the illumination apparatus.
Figure 19B:
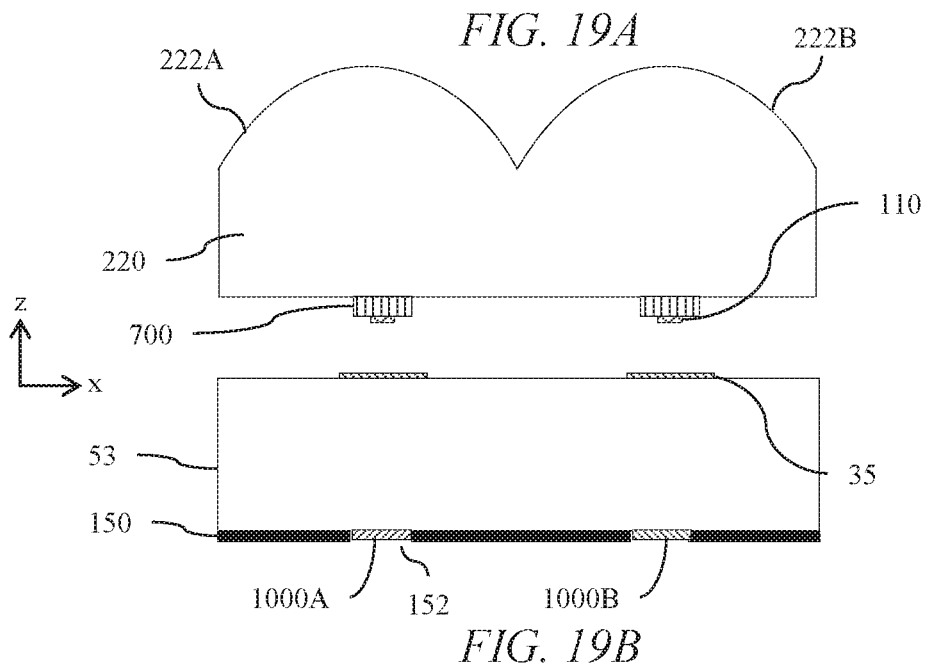
Figure 19C:
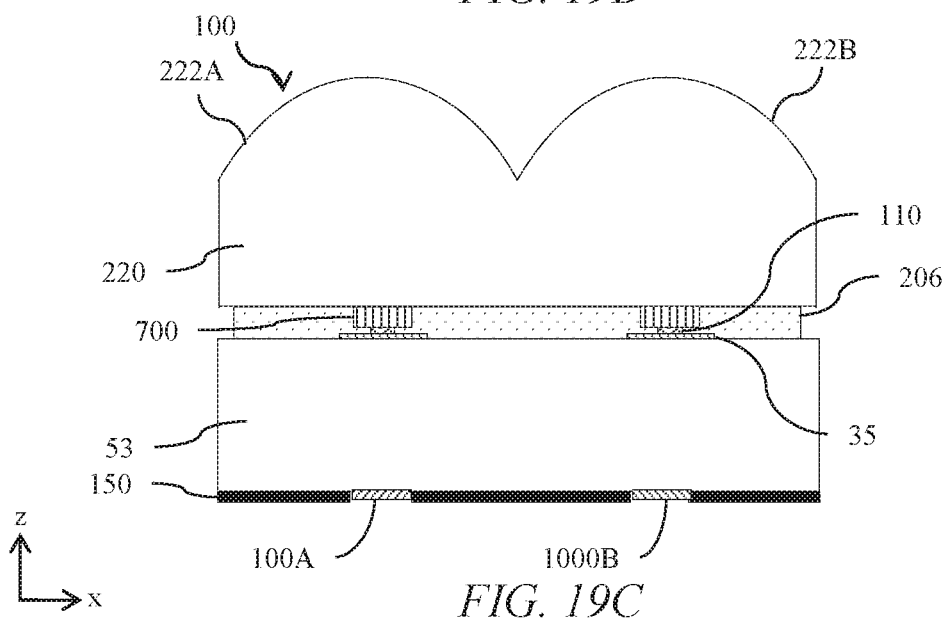

FIGS. 19A-C illustrate cross-sectional views of a method of manufacturing the illumination apparatus 100. Features of the embodiments of FIGS. 19A-C not discussed in further detail may be assumed to correspond to the features with equivalent reference numerals as discussed above, including any potential variations in the features.

As shown in FIG. 19A and FIG. 19B, in this method, the passive optical nanostructures 700 are first mounted to the optical structure 220 such that each passive optical nanostructures 700 is aligned with a respective curved reflective surface 222A, 222B of the optical structure 220. Then, the light emitting elements 110 are mounted to the passive optical nanostructures 700 such that each light emitting element 110 is aligned with a respective passive optical nanostructure 700. Then, as shown in FIG. 19C, a further support substrate 53 comprising reflective mask 35 is bonded to the optical structure 220, e.g. with adhesive layer 206 as described above with reference to FIGS. 17A-B and FIGS. 18A-B. Substrate 35 may optionally further comprising drive electrodes and circuitry (not shown).

Advantageously alignment of the light emitting elements 110 to the curved reflective surfaces 222A, 222B is achieved during the attachment step, increasing uniformity of alignment.

In the embodiments of FIGS. 17A-19C the passive optical elements may further comprise other passive optical elements to provide further modification of optical output as described elsewhere herein.

As further illustrated in FIG. 19B, passive optical elements 1000A, 1000B may be formed in the aperture regions 152A, 152B using the methods as described elsewhere herein. The polarisation, colour and reflectivity of the light transmitted through the apertures 152 may be modified. Further, such passive optical elements are remote from the light emitting elements 110 and so degradations due to heating are reduced, advantageously increasing lifetime.

A method to transfer passive optical nanostructures using a transfer substrate will now be further described.

Figure 20A:
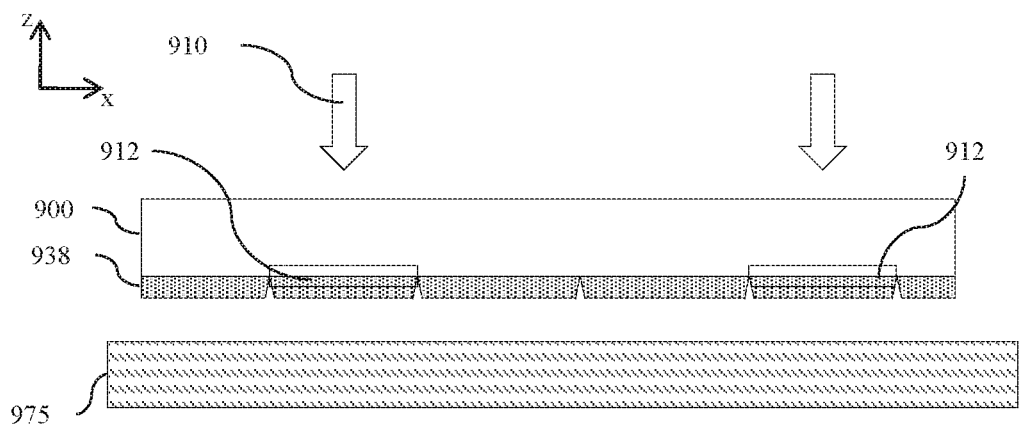
FIGS. 20A-20C illustrate cross-sectional views of a further method of transferring passive optical nanostructures onto respective light emitting elements.
Figure 20B:
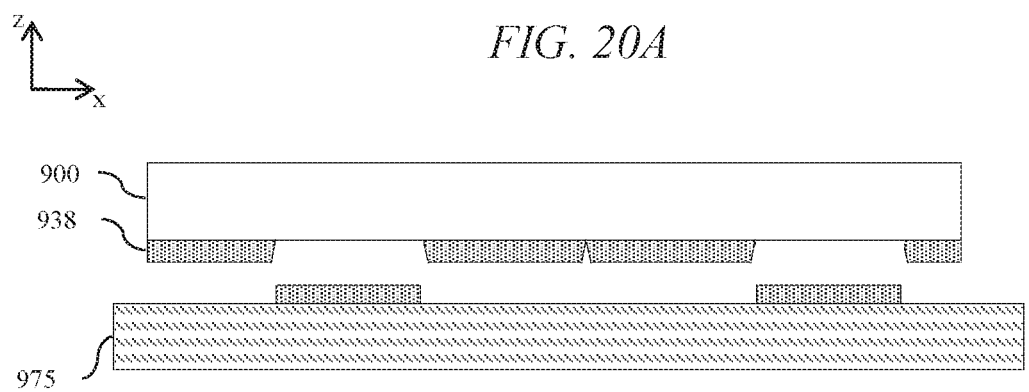
Figure 20C:
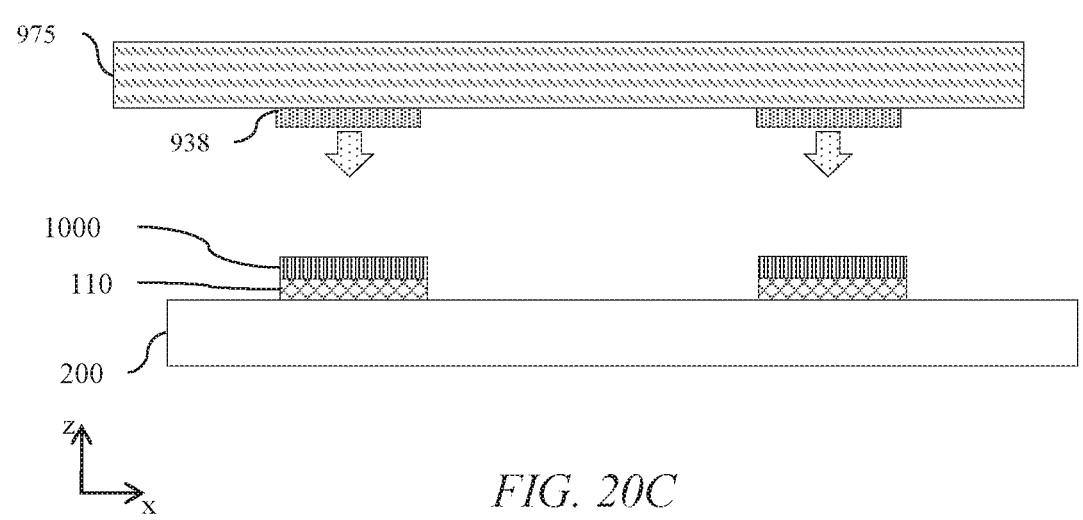

FIGS. 20A-C illustrate cross-sectional views of a further method of transferring passive optical nanostructures 938 onto respective light emitting elements 110.

First, as shown in FIG. 20A, a growth substrate 900 with a monolithic array of passive optical nanostructures 938 thereon is positioned above a receiver substrate 975. Then, regions 912 corresponding to selected passive optical nanostructures 938 are illuminated with light 910 such as UV light which at least partially separates the selected passive optical nanostructures 938 from the growth substrate 900.

As shown in FIG. 20B, then the selected passive optical nanostructures 938 corresponding to the illuminated regions 912 are detached from the growth substrate 900 and adhered to the receiver substrate. The receiver substrate 975 may be adhesive such that the selected passive optical nanostructures 938 attach thereto when brought into contact with the receiver substrate 975.

Then, as shown in FIG. 20C, the receiver substrate 975 with the selected passive optical nanostructures thereon is positioned above the support substrate 200 which has the light emitting elements 110 thereon, such that each selected passive optical nanostructure 938 is aligned with a respective light emitting element 110.

In this embodiment, the light emitting elements 110 each also have a respective passive optical nanostructure 1000 of a different type stacked thereon. Then, the selected passive optical nanostructures 938 on the receiver substrate 975 are transferred from the receiver substrate 975 onto their respective light emitting elements 110 such that the selected passive optical nanostructures 938 are each mounted to the top of the stack.

Advantageously the receiver substrate 975 is a transfer substrate that may have different material properties to the support substrate 200. For example the receiver substrate 975 may be a flexible material to aid alignment between the array of passive optical nanostructures 1000 and the light emitting elements 110 in the z-direction. Further multiple receiver substrates 975 may be used from each monolithic wafer 900, advantageously increasing throughput and reducing particle contamination from the monolithic wafer onto the support substrate 200. Yield may be increased and cost reduced.

It may be desirable to assemble a stack of passive optical nanostructures before transfer on to a support substrate.

Figure 21A:
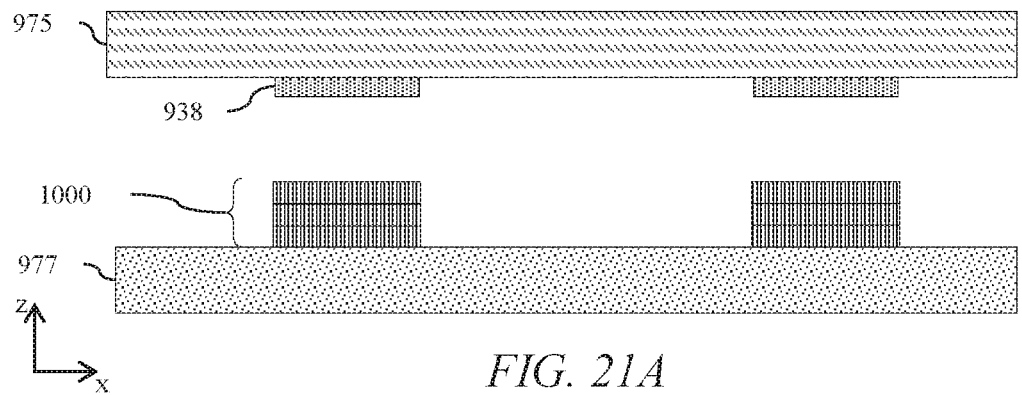
FIGS. 21A-D illustrate cross-sectional views of a further method of transferring passive optical nanostructures onto respective light emitting elements.
Figure 21B:
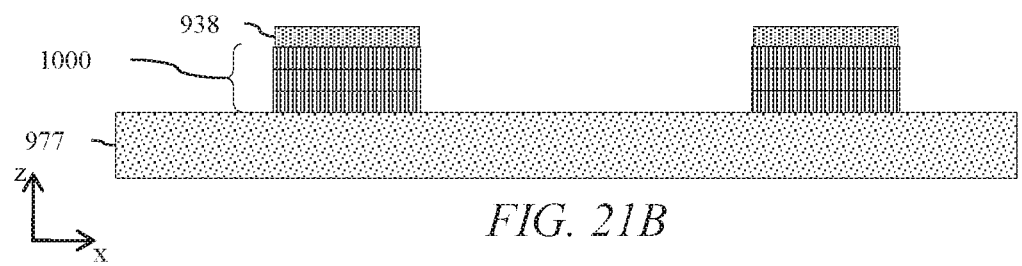
Figure 21C:
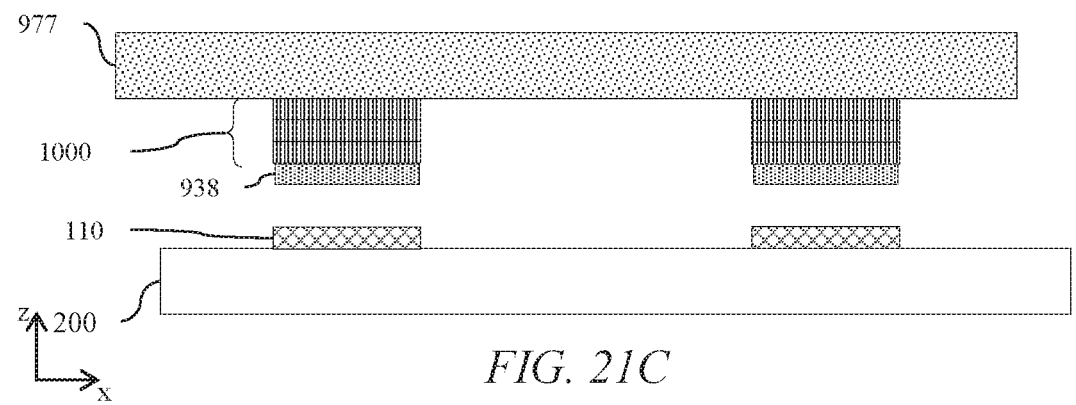
Figure 21D:
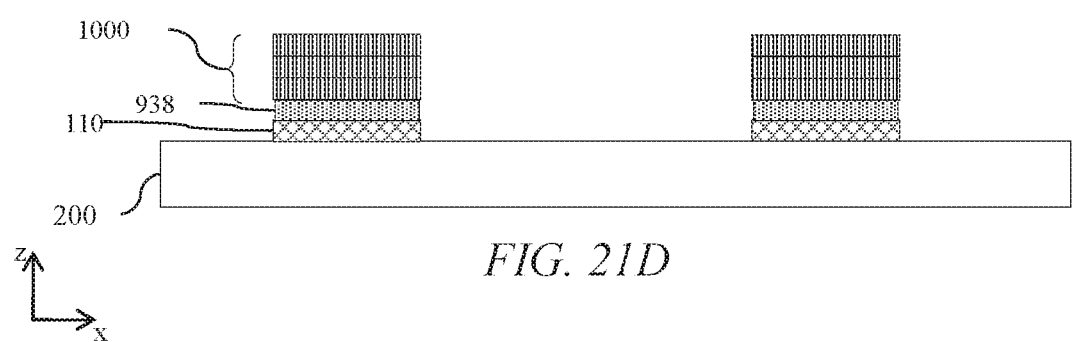

FIGS. 21A-D illustrate cross-sectional views of a further method of transferring passive optical nanostructures 938 onto respective light emitting elements 110. This method is similar to the method shown in FIGS. 20A-C, but in this method, as shown in FIG. 21A and FIG. 21B, after being transferred to the receiver substrate 975, the selected passive optical nanostructures 938 are transferred onto a stack of other passive optical nanostructures 1000 which have already been built on another receiver substrate 977. Then, as shown in FIG. 21C and FIG. 21D, the entire stacks including the selected passive optical nanostructures 938 are aligned with and transferred onto respective light emitting elements 110.

The stack of passive optical nanostructures 1000 may be provided with high uniformity over a large area to advantageously achieve increased yield and uniformity in comparison to the arrangement of FIGS. 20A-C, without degradation of the substrate 200 comprising the light emitting elements 110.

Features of the embodiments of FIGS. 20A-C and FIGS. 21A-D not discussed in further detail may be assumed to correspond to the features with equivalent reference numerals as discussed above, including any potential variations in the features.

As may be used herein, the terms "substantially" and "approximately" provide an industry-accepted tolerance for its corresponding term and/or relativity between items. Such an industry-accepted tolerance ranges from zero percent to ten percent and corresponds to, but is not limited to, component values, angles, et cetera. Such relativity between items ranges between approximately zero percent to ten percent.

While various embodiments in accordance with the principles disclosed herein have been described above, it should be understood that they have been presented by way of example only, and not limitation. Thus, the breadth and scope of this disclosure should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the embodiment(s) set out in any claims that may issue from this disclosure. Specifically and by way of example, although the headings refer to a "Technical Field," the claims should not be limited by the language chosen under this heading to describe the so-called field. Further, a description of a technology in the "Background" is not to be construed as an admission that certain technology is prior art to any embodiment(s) in this disclosure. Neither is the "Summary" to be considered as a characterization of the embodiment(s) set forth in issued claims. Furthermore, any reference in this disclosure to "invention" in the singular should not be used to argue that there is only a single point of novelty in this disclosure. Multiple embodiments may be set forth according to the limitations of the multiple claims issuing from this disclosure, and such claims accordingly define the embodiment(s), and their equivalents, that are protected thereby. In all instances, the scope of such claims shall be considered on their own merits in light of this disclosure, but should not be constrained by the headings set forth herein.

The invention claimed is:

1. A method for manufacturing an illumination apparatus, the method comprising:
    forming an array of light-emitting elements;
    forming a first monolithic array of first passive optical nanostructures;
    selectively removing a plurality of first passive optical nanostructures from the first monolithic array in a manner that preserves the relative spatial position of the selectively removed first passive optical nanostructures, wherein the plurality of first passive optical nanostructures that are selectively removed from the first monolithic array are selected such that, in at least one direction, for at least one pair of the selectively removed first passive optical nanostructures in the at least one direction, for each respective pair there is at least one respective first passive optical nanostructure that is not selected that was positioned in the first monolithic array between the pair of selectively removed first passive optical nanostructures in the at least one direction;
    forming a first non-monolithic array of first passive optical nanostructures with the selectively removed first passive optical nanostructures in a manner that preserves the relative spatial position of the selectively removed first passive optical nanostructures; and
    aligning each of the first passive optical nanostructures of the first non-monolithic array of first passive optical nanostructures with a respective light-emitting element of the array of light emitting elements.

2. The method of claim 1, wherein the array of light-emitting elements is formed on a support substrate.

3. The method of claim 2, further comprising sandwiching the array of light-emitting elements and the first non-monolithic array of first passive optical nanostructures between the support substrate and another substrate opposite to the support substrate, such that each first passive optical nanostructure is aligned with a respective light-emitting element.

4. The method of claim 3, further comprising transferring the first non-monolithic array of first passive optical nanostructures onto the other substrate prior to the sandwiching.

5. The method of claim 3, further comprising transferring each of first passive optical nanostructures of the first non-monolithic array to a respective one of the light-emitting elements prior to the sandwiching.

6. The method of claim 1, further comprising stacking each of the first passive optical nanostructures of the first non-monolithic array of passive optical nanostructures onto a respective light emitting element of the array of light emitting elements.

7. The method of claim 1, further comprising:
measuring an optical or electrical characteristic of the first passive optical nanostructures for at least two regions of the first monolithic array;
classifying the measurement of the optical or electrical characteristic for each region as being above or below a pre-determined measurement threshold for the optical or electrical characteristic; and
only selectively removing first passive optical nanostructures from regions for which the measurement of the optical or electrical characteristic is either above or alternatively below the pre-determined measurement threshold.

8. The method of claim 1, further comprising:
providing a substrate that is transparent to light in an electromagnetic wavelength band;
forming a release layer on the first substrate, wherein the release layer is configured to at least partially separate from the substrate when exposed to light in the electromagnetic wavelength band; and
forming the first monolithic array of first passive optical nanostructures on the release layer.

9. The method of claim 8, wherein selectively removing the plurality of first passive optical nanostructures comprises:
illuminating with light in the electromagnetic wavelength band, through the substrate, regions of the release layer on which the selected plurality of first passive optical nanostructures are formed, thereby to at least partially separate the selected plurality of first passive optical nanostructures from the substrate.

10. The method of claim 9, wherein the illumination at least partially separates the selected plurality of first passive optical nanostructures from the rest of the first monolithic array of first passive optical nanostructures.

11. The method of claim 1, wherein the selected plurality of first passive optical nanostructures are at least partially separated from the rest of the first monolithic array of first passive optical nanostructures by etching, scribing or ablation.

12. The method of claim 9, wherein the illumination comprises a plurality of shaped laser beams.

13. The method of claim 9, wherein the electromagnetic wavelength band is an ultraviolet wavelength band.

14. The method of claim 9, wherein the illumination dissociates a material of the release layer to form a gas.

15. The method of claim 9, wherein the light in the electromagnetic wavelength band dissociates a layer of the material forming the first passive optical nanostructures.

16. The method of claim 1, further comprising:
transferring the selectively removed plurality of first passive optical nanostructures onto a transfer member; and
transferring each of the selectively removed plurality of first passive optical nanostructures from the transfer member onto a respective light emitting element.

17. The method of claim 1, further comprising:
forming the monolithic array of passive optical nanostructures on a first substrate, wherein the first substrate is opaque to light in an electromagnetic wavelength band;
transferring the monolithic array of passive optical nanostructures onto a second substrate, wherein the second substrate is transparent to light in the electromagnetic wavelength band; and
illuminating the plurality of first passive optical nanostructures through the second substrate with light in the electromagnetic wavelength band, thereby to at least partially separate the plurality of passive optical nanostructures from the second substrate.

18. The method of claim 1, wherein selectively removing the plurality of first passive optical nanostructures comprises adhering the plurality of first passive optical nanostructures to a first adhesive substrate in a manner that preserves the relative spatial position of the first passive optical nanostructures.

19. The method of claim 18, further comprising:
transferring the removed plurality of first passive optical nanostructures from the first adhesive substrate to a second adhesive substrate in a manner that preserves the relative spatial position of the selectively removed light-emitting elements; and
transferring the first passive optical nanostructures from the second adhesive substrate to a support substrate in a manner that preserves the relative spatial position of the selectively removed light-emitting elements.

20. The method of claim 18, wherein each of the first passive optical nanostructures comprises a first surface and a second surface opposite the first surface, and wherein the first passive optical nanostructures are adhered to the first adhesive substrate such that their first surfaces are in contact with the first adhesive substrate and their second surfaces are exposed.

21. The method of claim 19, wherein the first passive optical nanostructures are transferred to the second adhesive substrate such that their second surfaces are in contact with the second adhesive substrate and their first surfaces are exposed.

22. The method of claim 19, wherein the first passive optical nanostructures are transferred to the support substrate such that their first surfaces are in contact with the support substrate and their second surfaces are exposed.

23. The method of claim 19, wherein the adhesive force between the first passive optical nanostructures and the second adhesive substrate is greater than the adhesive force between first passive optical nanostructures and the first adhesive substrate.

24. The method of claim 19, wherein the adhesive force between the first passive optical nanostructures and the support substrate is greater than the adhesive force between the first passive optical nanostructures and the second adhesive substrate.

25. The method of claim 19, wherein the support substrate is a planar substrate.

26. The method of claim 1, wherein each of the light-emitting elements is a micro-LED comprising a maximum dimension of at most 300 micrometers.

27. The method of claim 1, wherein each of the first passive optical nanostructures has a maximum dimension of at most 400 micrometers.

28. The method of claim 1, wherein a maximum dimension of each of the first passive optical nanostructures is greater than or equal to a maximum dimension of a light-emitting area of a light emitting element aligned with that first passive optical nanostructure.

29. The method of claim 1, wherein the first passive optical nanostructures comprise one or more sub-features with a maximum dimension of at most 5 micrometers.

30. The method of claim 1, wherein the first passive optical nanostructures comprise any one of the following types:
wire grid polarisers;
form birefringence retarders;
quantum dot or quantum rod color conversion structures;
distributed Bragg reflectors;
metamaterials;
Fabry Perot resonator structures;
dichroic stacks;
holograms;
moth-eye structures;
nano-black materials;
nano-collimators;
air gap enclosing nanocolumns;
photonic crystals.

31. The method of claim 1, wherein the first passive optical nanostructures are wire grid polarisers.

32. The method of claim 31, wherein at least one of the wire grid polarisers is aligned with its respective light emitting element with a first orientation and at least one other wire grid polariser is aligned with its respective light emitting element with a second orientation, the second orientation being orthogonal to the first orientation.

33. The method of claim 1, wherein the first passive optical nanostructures are quantum dot or quantum rod color conversion structures.

34. The method of claim 1, wherein at least one of the light emitting elements of the non-monolithic array of light emitting elements does not have a quantum dot or quantum rod color conversion structure aligned therewith.

35. The method of claim 1, further comprising:
forming a second monolithic array of second passive optical nanostructures;
selectively removing a plurality of second passive optical nanostructures from the second monolithic array in a manner that preserves the relative spatial position of the selectively removed second passive optical nanostructures, wherein the plurality of second passive optical nanostructures that are selectively removed from the second monolithic array are selected such that, in at least one direction, for at least one pair of the selectively removed second passive optical nanostructures in the at least one direction, for each respective pair there is at least one respective second passive optical nanostructure that is not selected that was positioned in the second monolithic array between the pair of selectively removed second passive optical nanostructures in the at least one direction;
forming a second non-monolithic array of second passive optical nanostructures with the selectively removed second passive optical nanostructures in a manner that preserves the relative spatial position of the selectively removed second passive optical nanostructures; and
aligning each of the second passive optical nanostructures of the second non-monolithic array of second passive optical nanostructures with a respective light-emitting element of the array of light emitting elements.

36. The method of claim 35, wherein the first passive optical nanostructures are a different type of passive optical nanostructure to the second passive optical nanostructures.

37. The method of claim 35, wherein the first monolithic array of first passive optical nanostructures is formed separately to the second monolithic array of second passive optical nanostructures.

38. The method of claim 35, further comprising stacking each second passive optical nanostructures of the second non-monolithic array of passive optical nanostructures onto either a respective light emitting element or a respective first passive optical nanostructure.

39. The method of claim 35, wherein:
at least one of the light emitting elements with a first passive optical nanostructure aligned therewith does not have a second passive optical nanostructure aligned therewith; and/or
at least one of the light emitting elements with a second passive optical nanostructure aligned therewith does not have a first passive optical nanostructure aligned therewith.

40. The method of claim 1, wherein the array of light-emitting elements is formed by:
forming a monolithic array of light emitting elements;
selectively removing a plurality of light emitting elements from the monolithic array in a manner that preserves the relative spatial position of the selectively removed light emitting elements, wherein the plurality of light emitting elements that are selectively removed from the first monolithic array are selected such that, in at least one direction, for at least one pair of the selectively removed light emitting elements in the at least one direction, for each respective pair there is at least one respective light emitting elements that is not selected that was positioned in the first monolithic array between the pair of selectively removed light emitting elements in the at least one direction; and
forming the array of light emitting elements with the selectively removed light emitting elements in a manner that preserves the relative spatial position of the selectively removed light emitting elements.

41. The method of claim 1, further comprising forming an illumination apparatus with the aligned first non-monolithic array of first passive optical nanostructures and the array of light emitting elements.

42. The method of claim 41, further comprising forming a display apparatus with the illumination apparatus.

43. The method of claim 1, wherein the array of light-emitting elements is a non-monolithic array of light-emitting elements.

* * * * *